(12) United States Patent
Murakoshi et al.

(10) Patent No.: US 8,178,913 B2
(45) Date of Patent: May 15, 2012

(54) SEMICONDUCTOR DEVICE AND METHOD FOR MANUFACTURING SAME

(75) Inventors: Atsushi Murakoshi, Kanagawa-ken (JP); Katsunori Yahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/926,771

(22) Filed: Dec. 8, 2010

(65) Prior Publication Data

US 2011/0079833 A1 Apr. 7, 2011

Related U.S. Application Data

(62) Division of application No. 12/388,667, filed on Feb. 19, 2009, now Pat. No. 7,928,483.

(30) Foreign Application Priority Data

Feb. 22, 2008 (JP) ................................. 2008-042010

(51) Int. Cl.
*H01L 31/062* (2012.01)
*H01L 31/113* (2006.01)

(52) U.S. Cl. ........................................ 257/291; 257/292

(58) Field of Classification Search .................. 257/509, 257/519, 398–400, 291
See application file for complete search history.

(56) References Cited

U.S. PATENT DOCUMENTS

| 3,886,000 A * | 5/1975 | Bratter et al. ................. 438/363 |
| 3,900,350 A * | 8/1975 | Appels et al. ................. 438/442 |
| 6,096,612 A | 8/2000 | Houston |
| 2001/0049170 A1 * | 12/2001 | Chen et al. .................... 438/258 |
| 2002/0187581 A1 | 12/2002 | Yang |
| 2006/0118917 A1 | 6/2006 | Gong et al. |

FOREIGN PATENT DOCUMENTS

| JP | 2006-24786 | 1/2006 |
| JP | 2006-93319 | 4/2006 |

OTHER PUBLICATIONS

Notification of Reason(s) for Refusal issued by the Japanese Patent Office on Feb. 4, 2011, for Japanese Patent Application No. 2008-042010, and English-language translation thereof.
Itonaga et al., "A High-Performance and Low-Noise CMOS Image Sensor With an Expanding Photodiode Under the Isolation Oxide", IEEE, 0-7803-9269-8, 4 sheets (2005).

(Continued)

*Primary Examiner* — Thien F Tran
(74) *Attorney, Agent, or Firm* — Finnegan, Henderson, Farabow, Garrett & Dunner, L.L.P.

(57) ABSTRACT

A hard mask material film is formed on a semiconductor substrate and a recess is formed immediately below an opening in an upper surface of the semiconductor substrate. Next, a p-type region is formed immediately below the recess by implanting impurities into an imaging region using the hard mask material film as a mask. Moreover, a trench is formed by further processing the recess in a processing region. A half-buried dielectric film and a STI are formed by burying a dielectric material in the recess and the trench to remove the hard mask material film. Next, two electrodes are formed so as to overlap the half-buried dielectric film and the STI, respectively, and impurities are implanted into the imaging region using one electrode and the half-buried dielectric film as a mask, and hence a n-type region constituting a photodiode is formed in a region being in contact with the p-type region in the semiconductor substrate.

8 Claims, 19 Drawing Sheets

OTHER PUBLICATIONS

Notification of the First Office Action issued by the Chinese Patent Office on Apr. 14, 2010, for Chinese Patent Application No. 200910004715.3, and English-language translation thereof.

Notification of Second Office Action issued by the Patent Office of the People's Republic of China for Application No. 200910004715.3, and English-language translation thereof.

* cited by examiner

SEMICONDUCTOR DEVICE AND METHOD FOR MANUFACTURING SAME

CROSS-REFERENCE TO RELATED APPLICATIONS

This is a division of Application No. 12/388,667, filed Feb. 19, 2009 now U.S. Pat No. 7,928, 483, which is incorporated herein by reference.

This application is based upon and claims the benefit of priority from the prior Japanese Patent Application No. 2008-042010, filed on Feb. 22, 2008; the entire contents of which are incorporated herein by reference.

BACKGROUND OF THE INVENTION

1. Field of the Invention

This invention relates to a semiconductor device and a method for manufacturing the same, and more particularly to a semiconductor device including elements partly isolated from each other by a semiconductor region and a method for manufacturing the same.

2. Background Art

In general, element isolation in a semiconductor device is performed by the STI (shallow trench isolation) method, where the silicon substrate is etched to form a trench, in which a dielectric film is buried. However, application of this STI method to an image acquisition device (hereinafter referred to as "imaging device"), such as a CMOS (complementary metal oxide semiconductor) image sensor, causes the following problem.

If photodiodes in the imaging device are isolated from each other by an STI, damage occurs during etching the silicon substrate, and stress is applied during burying a dielectric film in the trench, resulting in introducing crystal defects in the silicon substrate. Thus, the unpaired electron pair of the crystal defect acts as a carrier and produces a white spot in the image. To prevent this, the STI needs to be enclosed by a well (inversion layer), but this decreases the area of the photodiode by the margin of the well. Consequently, the number of saturated electrons during photoelectric conversion decreases, causing degradation in image characteristics, such as decreased sensitivity. This problem manifests itself particularly with the reduction of the pixel pitch.

In this context, as an approach to achieving sufficient element isolation capability while preventing degradation in image characteristics, application of element isolation based on the mesa isolation method to an imaging device is under study. Mesa isolation is a method of PN isolation in which a semiconductor region is formed between elements, and a dielectric film is provided on the semiconductor region. For example, a technique for combined use of STI isolation and mesa isolation in a CMOS image sensor is disclosed in Kazuichiroh Itonaga et al., "A High-Performance and Low-Noise CMOS Image Sensor with an Expanding Photodiode under the Isolation Oxide", 2005 IEEE 0-7803-9269-8.

However, in the technique disclosed in the above document, the height of the dielectric film of mesa isolation is not matched with the height of the dielectric film of STI. Unfortunately, this increases the difficulty of subsequent processes, which interferes with device downscaling.

SUMMARY OF THE INVENTION

According to an aspect of the invention, there is provided a semiconductor device including: a semiconductor substrate; a first-conductivity-type region formed in an upper portion of the semiconductor substrate and having a first conductivity type; a second-conductivity-type region formed in an upper portion of the semiconductor substrate, being in contact with the first-conductivity-type region, and having a second conductivity type that is different from the first conductivity type; and a half-buried dielectric film provided immediately above the second-conductivity-type region, having a lower portion buried in the semiconductor substrate, and having an upper portion protruding from an upper surface of the semiconductor substrate, the second-conductivity-type region and the half-buried dielectric film isolating the first-conductivity-type region from a region that is on opposite side of the first-conductivity-type region across the second-conductivity-type region and is in contact with the second-conductivity-type region.

According to another aspect of the invention, there is provided a method for manufacturing a semiconductor device, including: forming a hard mask material film on a semiconductor substrate; forming an opening in the hard mask material film and forming a recess in an upper surface of the semiconductor substrate immediately below the opening by etching; forming a second-conductivity-type region in the semiconductor substrate immediately below the recess by implanting impurities using the hard mask material film as a mask; burying a dielectric material in the opening and in the recess; forming a half-buried dielectric film having a lower portion buried in the semiconductor substrate and an upper portion protruding from the upper surface of the semiconductor substrate by removing the hard mask material film; and forming a first-conductivity-type region in a region of the semiconductor substrate being in contact with the second-conductivity-type region by implanting impurities using the half-buried dielectric film as a mask.

According to still another aspect of the invention, there is provided a method for manufacturing a semiconductor device, including: forming a first hard mask material film on a semiconductor substrate; forming an opening in the first hard mask material film and forming a recess in an upper surface of the semiconductor substrate immediately below the opening by etching; removing the first hard mask material film; forming a second hard mask material film on the semiconductor substrate and on an inner surface of the recess; forming a second-conductivity-type region in the semiconductor substrate immediately below the recess by implanting impurities using the second hard mask material film as a mask; burying a dielectric material in the opening and in the recess; forming a half-buried dielectric film, which has a lower portion buried in the semiconductor substrate and an upper portion protruding from the upper surface of the semiconductor substrate, and a buffer dielectric film, which covers a portion of the half-buried dielectric film buried in the recess, by removing the second hard mask material film deposited on the upper surface of the semiconductor substrate and leaving the second hard mask material film deposited on the inner surface of the recess; and forming a first-conductivity-type region in a region of the semiconductor substrate being in contact with the second-conductivity-type region by implanting impurities using the half-buried dielectric film as a mask.

DETAILED DESCRIPTION OF THE INVENTION

Embodiments of the invention will now be described with reference to the drawings, beginning with a first embodiment of the invention.

Figure 1:
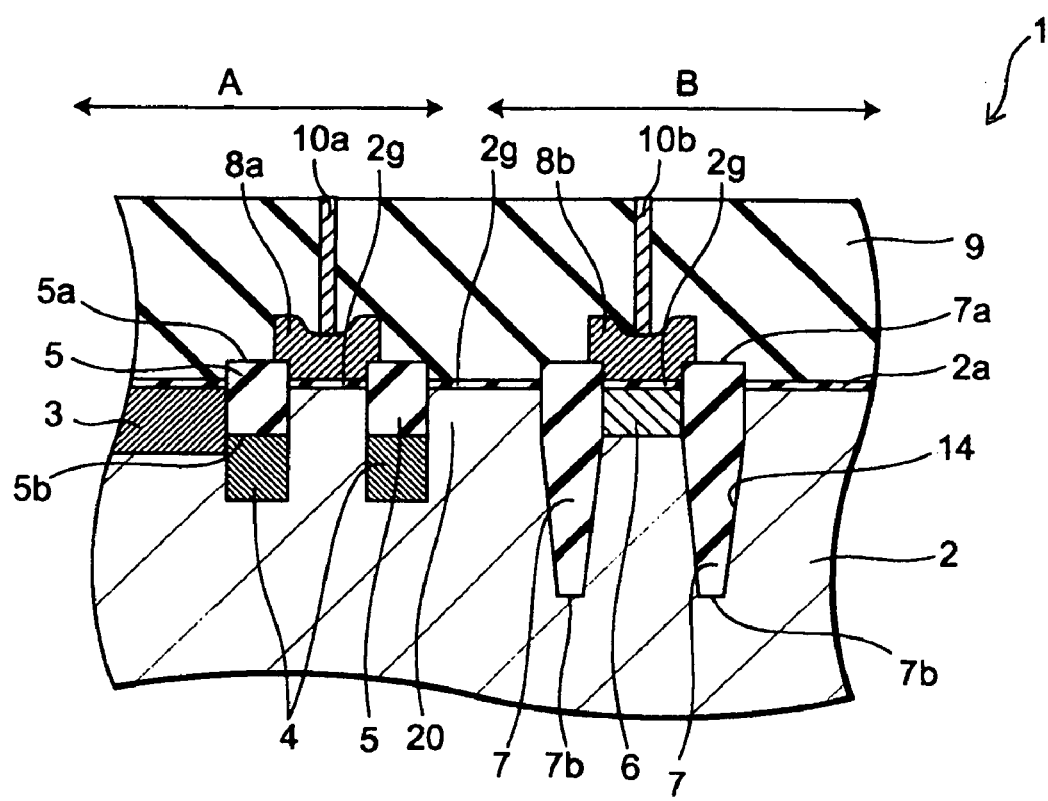
FIG. 1 is a cross-sectional view illustrating a semiconductor device according to a first embodiment of the invention.

FIG. 1 is a cross-sectional view illustrating a semiconductor device according to this embodiment.

The semiconductor device 1 according to this embodiment is illustratively an imaging device.

As shown in FIG. 1, the semiconductor device 1 according to this embodiment includes a semiconductor substrate 2. The semiconductor substrate 2 has an imaging region A, which includes an N-channel MOSFET (metal oxide semiconductor field effect transistor) (hereinafter referred to as "NMOS") and converts incident light to an electrical signal, and a processing region B, which includes an NMOS and a P-channel MOSFET (hereinafter referred to as "PMOS") and processes the electrical signal outputted from the imaging region A.

An n-type region 3 (first-conductivity-type region) constituting a photodiode is formed in part of the upper portion of the semiconductor substrate 2 in the imaging region A. A p-type region 4 (second-conductivity-type region) and a half-buried dielectric film 5 constituting mesa isolation are provided in another part of the upper portion of the semiconductor substrate 2. The half-buried dielectric film 5 is provided immediately above the p-type region 4. A lower portion of the half-buried dielectric film 5 is buried in the semiconductor substrate 2, and an upper portion of the half-buried dielectric film 5 protrudes from the upper surface 2a of the semiconductor substrate 2. That is, the lower surface 5b of the half-buried dielectric film 5 is located below the upper surface 2a of the semiconductor substrate 2, and the upper surface 5a of the half-buried dielectric film 5 is located above the upper surface 2a of the semiconductor substrate 2. For example, in the example shown in FIG. 1, mesa isolations are provided at two sites. The p-type region 4 and the half-buried dielectric film 5 constituting one mesa isolation are in contact with the n-type region 3. Thus, this set of the p-type region 4 and the half-buried dielectric film 5 isolates the n-type region 3 in the semiconductor substrate 2 from the region that is on the opposite side of the n-type region 3 across the p-type region 4 and is in contact with the p-type region 4, that is, the region 20 immediately below the electrode 8a in the upper portion of the semiconductor substrate 2.

On the other hand, the processing region B includes an NMOS and a PMOS as described above. The channel region 6 of the PMOS is formed in part of the upper portion of the semiconductor substrate 2 in the region B, and a pair of STIs 7 is buried as element isolation films on both lateral sides of the channel region 6. The STI 7 isolates the PMOS including the channel region 6 from other transistors formed in the semiconductor substrate 2, and extends from a position higher than the upper end portion of the channel region 6 to a position lower than the lower end portion of the channel region 6. That is, the upper surface 7a of the STI 7 is located above the upper surface 2a of the semiconductor substrate 2. Furthermore, the lower surface 7b of the STI 7 is located below the lower end portion of the channel region 6 and located below the lower surface 5b of the half-buried dielectric film 5.

Furthermore, an electrode 8a is provided on the semiconductor substrate 2 so as to overlap the half-buried dielectric film 5. To insulate the electrode 8a from the n-type region 3, the thickness of the half-buried dielectric film 5 is not less than a certain dimension. Furthermore, an electrode 8b is provided so as to overlap the STI 7. A gate dielectric film 2g is formed at the portion between the semiconductor substrate 2 and the electrode 8a or 8b where the half-buried dielectric film 5 or the STI 7 is not provided. Furthermore, an interlayer dielectric film 9 is provided on the semiconductor substrate 2 so as to cover the electrodes 8a and 8b. Contacts 10a and 10b are formed in the interlayer dielectric film 9 so as to be connected to the electrodes 8a and 8b, respectively. An upper interconnect layer (not shown) is provided on the interlayer dielectric film 9.

Next, a method for manufacturing the semiconductor device 1 according to this embodiment is described.

FIGS. 2A to 2C, 3A, 3B, 4A, 4B, 5A, 5B, 6A, and 6B are process cross-sectional views illustrating the method for manufacturing the semiconductor device according to this embodiment.

Figure 2A:
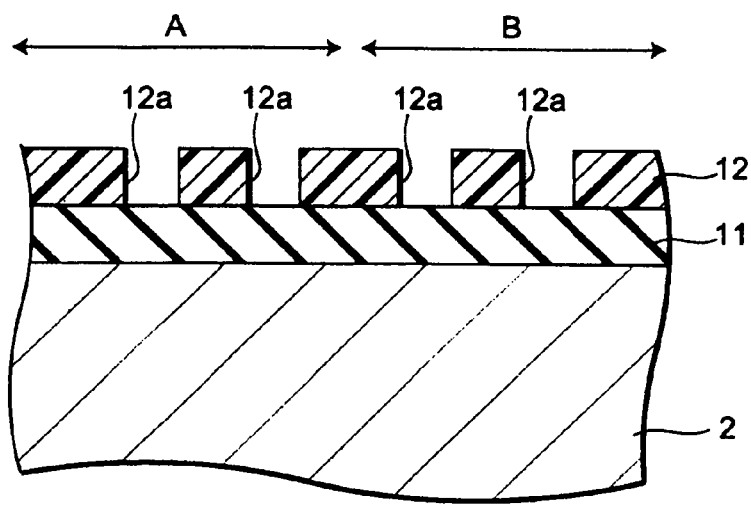
FIGS. 2A to 2C are process cross-sectional views illustrating a method for manufacturing the semiconductor device according to the first embodiment.

First, as shown in FIG. 2A, a hard mask material film 11 is formed entirely on a semiconductor substrate 2, and a resist pattern 12 is formed thereon. The semiconductor substrate 2 and the hard mask material film 11 are illustratively formed from silicon (Si) and silicon nitride (SiN), respectively. Here, in the resist pattern 12, openings 12a are formed in each of the region A and the region B.

Figure 2B:
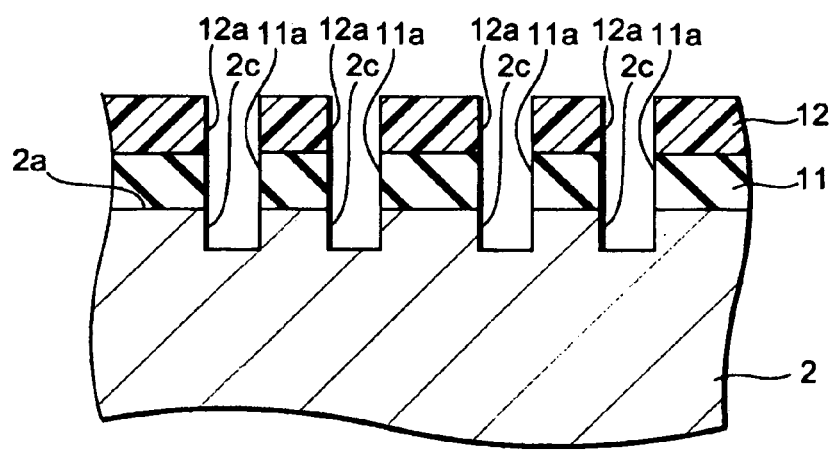

Next, as shown in FIG. 2B, the resist pattern 12 is used as a mask to perform dry etching. Thus, immediately below the opening 12a of the resist pattern 12, the hard mask material film 11 is removed throughout the thickness, and an upper portion of the semiconductor substrate 2 is also removed. Consequently, openings 11a are formed in the hard mask material film 11, and recesses 2c are formed at the upper surface 2a of the semiconductor substrate 2 immediately below the openings 11a. Subsequently, the resist pattern 12 is removed.

Figure 2C:
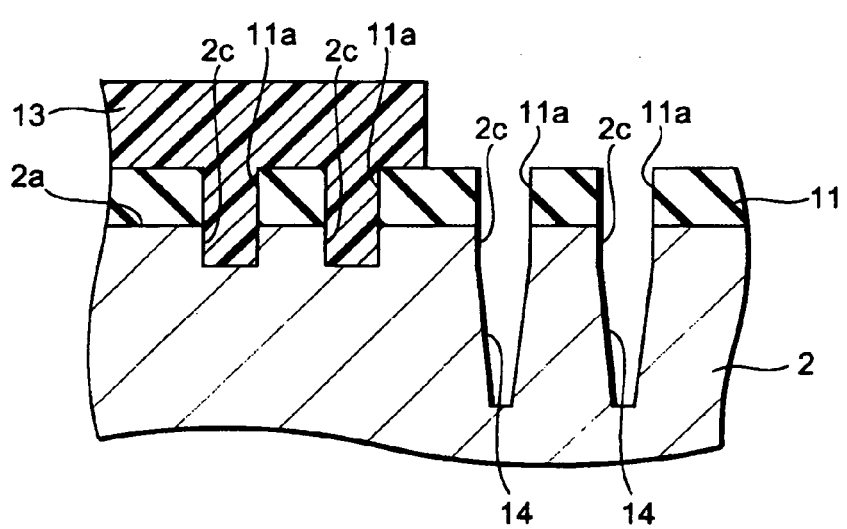

Next, as shown in FIG. 2C, a resist pattern 13 is formed on the hard mask material film 11 so as to cover the region A and expose the region B. Then, the resist pattern 13 and the hard mask material film 11 are used as a mask to perform dry etching. Thus, in the region B, the bottom of the recess 2c of the semiconductor substrate 2 is further removed to form a trench 14. Subsequently, the resist pattern 13 is removed.

Figure 3A:
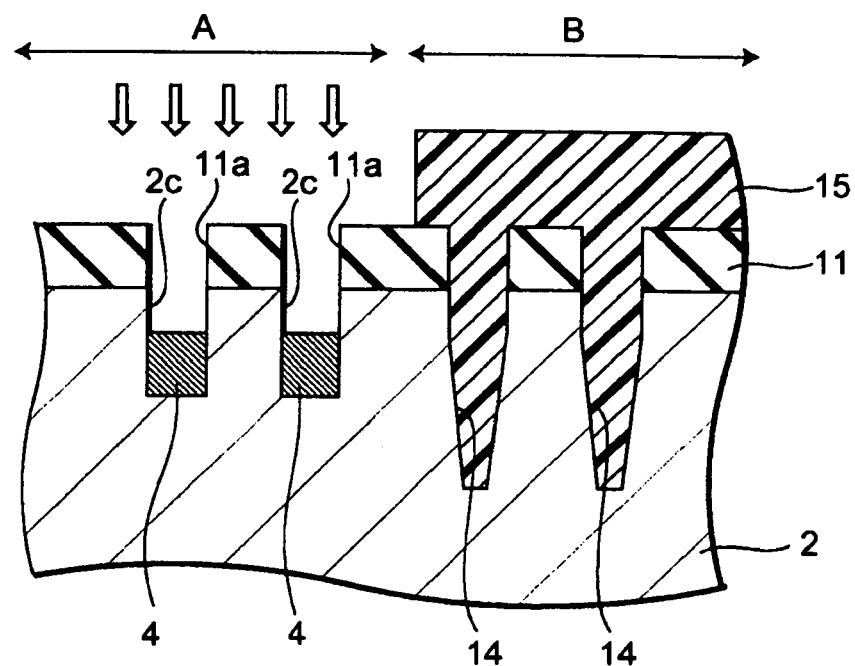
FIGS. 3A and 3B are process cross-sectional views illustrating a method for manufacturing the semiconductor device according to the first embodiment.

Next, as shown in FIG. 3A, a resist pattern 15 is formed on the hard mask material film 11 so as to cover the region B and expose the region A. Then, the resist pattern 15 and the hard mask material film 11 are used as a mask to implant acceptor impurities. Thus, a p-type region 4 is formed immediately below the opening 11a of the region A in the semiconductor substrate 2, that is, immediately below the recess 2c. Subsequently, the resist pattern 15 is removed.

Figure 3B:
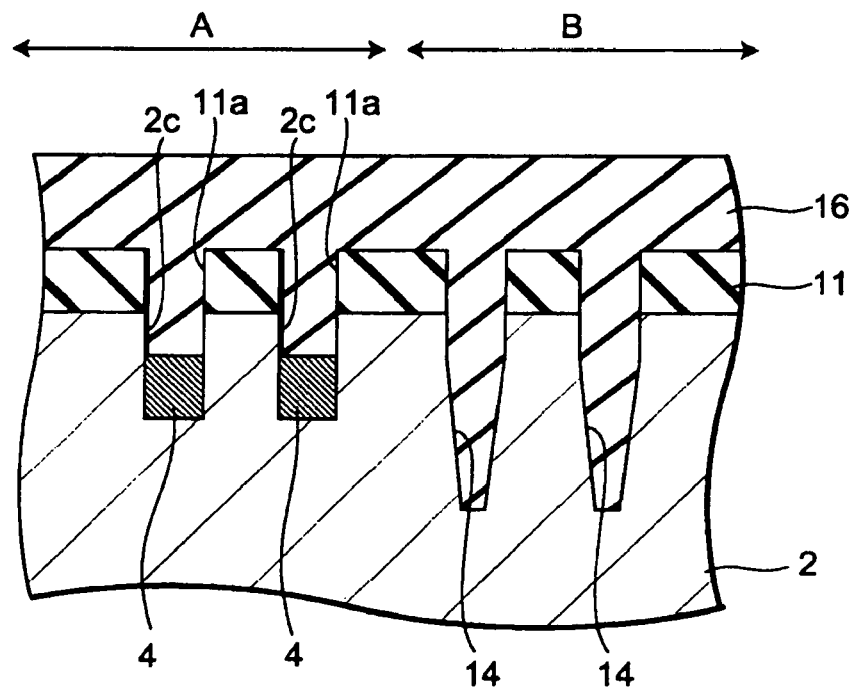

Next, as shown in FIG. 3B, a dielectric material 16 is deposited on the entire surface. Here, the dielectric material 16 is buried also inside the recess 2c in the region A and inside the trench 14 in the region B. Next, CMP (chemical mechanical polishing) or other planarization processing is applied to the dielectric material 16 to expose the hard mask material film 11.

Figure 4A:
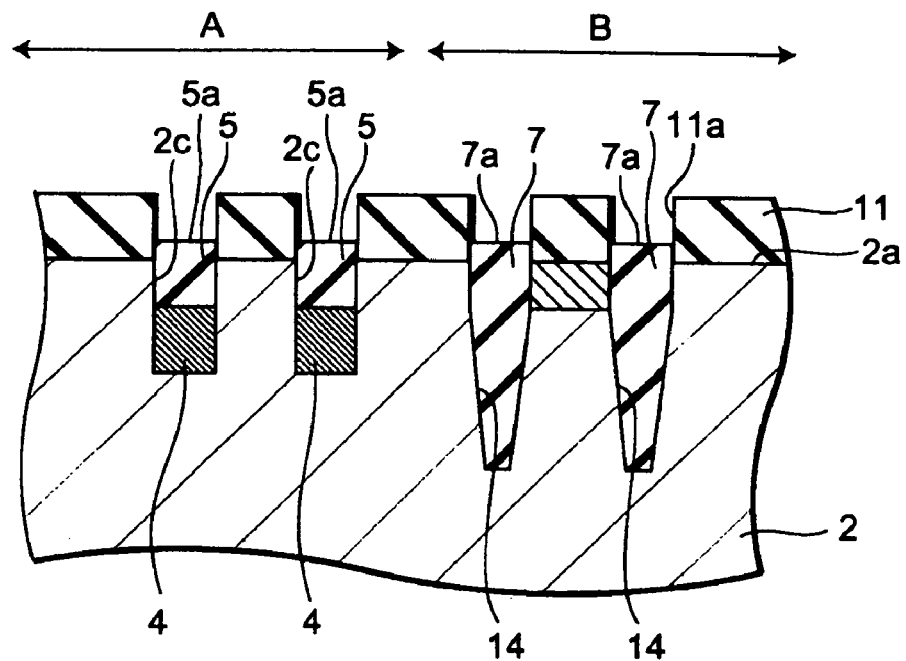
FIGS. 4A and 4B are process cross-sectional views illustrating a method for manufacturing the semiconductor device according to the first embodiment.

Next, as shown in FIG. 4A, wet etching is performed on the entire surface to remove the portion of the dielectric material 16 buried in an upper portion of the opening 11a. Here, the dielectric material 16 is left in the recess 2c and in a lower portion of the opening 11a immediately thereabove, and in the trench 14 and in a lower portion of the opening 11a immediately thereabove to serve as a half-buried dielectric film 5 and an STI 7, respectively. The half-buried dielectric film 5 is formed immediately above the p-type region 4. Because the half-buried dielectric film 5 and the STI 7 are formed by removing the dielectric material 16 in the same wet etching process, the height of the upper surface 5a of the half-buried dielectric film 5 is generally the same as the height of the upper surface 7a of the STI 7. Subsequently, the hard mask material film 11 is removed. Thus, the upper portion of the half-buried dielectric film 5 and the upper portion of the STI 7 protrude from the upper surface 2a of the semiconductor substrate 2.

Figure 4B:
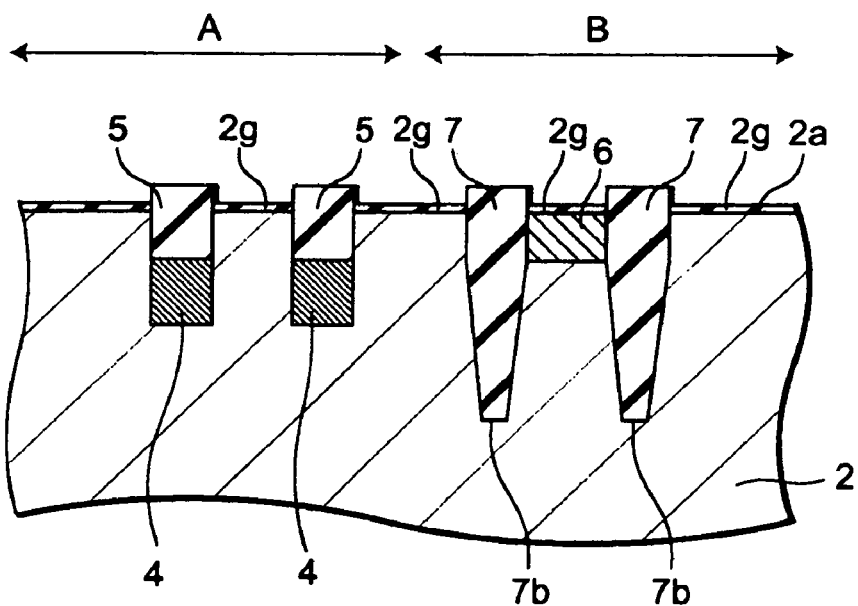

Next, as shown in FIG. 4B, a channel region 6 is formed in a region between the STIs 7 in the region B and above the lower surface 7b. The PMOS including the channel region 6 is isolated from the surroundings by the STIs 7. Subsequently, a gate dielectric film 2g is formed at the exposed portion of the upper surface 2a of the semiconductor substrate 2 by thermal oxidation.

Figure 5A:
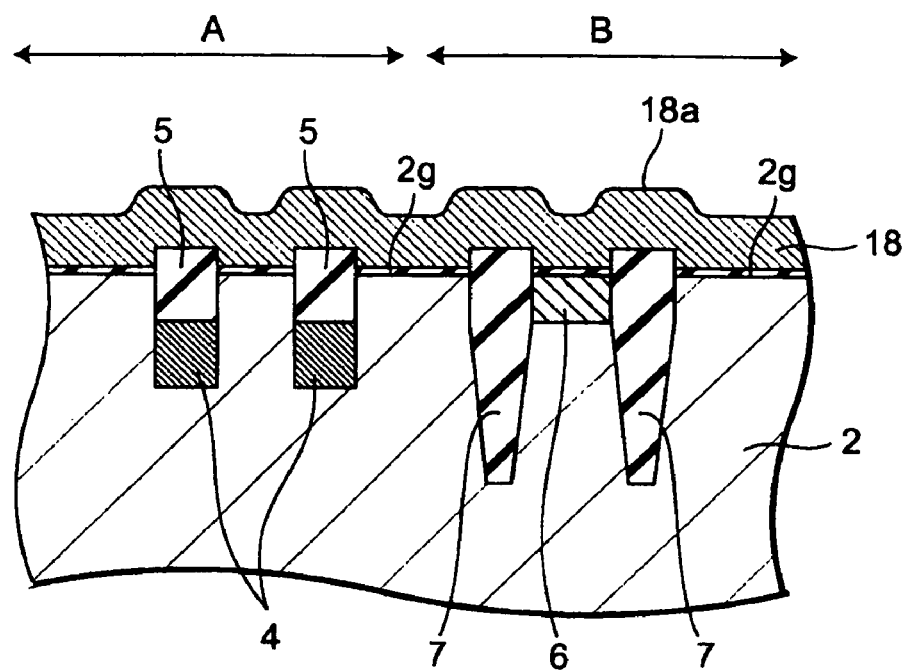
FIGS. 5A and 5B are process cross-sectional views illustrating a method for manufacturing the semiconductor device according to the first embodiment.

Next, as shown in FIG. 5A, a conductive material is deposited entirely on the semiconductor substrate 2 to form a conductive film 18. Here, the conductive film 18 is continuously formed so as to cover the gate dielectric film 2g, the half-buried dielectric film 5, and the STI 7. The shape of the upper surface 18a of the conductive film 18 reflects the protruding portion of the half-buried dielectric film 5 and the protruding portion of the STI 7. That is, the upper surface 18a immediately above the half-buried dielectric film 5 and immediately above the STI 7 is projected from the surroundings with generally the same dimension.

Figure 5B:
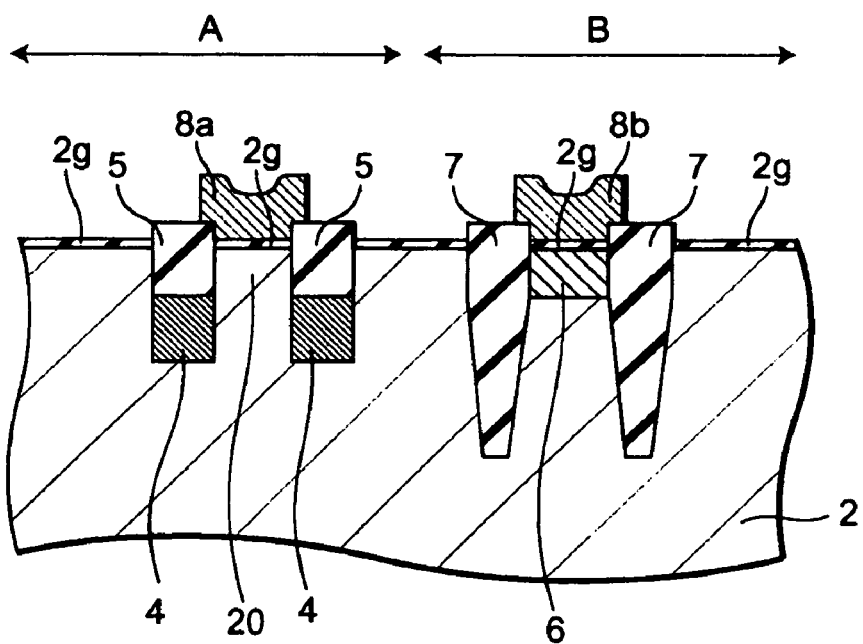

Next, as shown in FIG. 5B, the conductive film 18 is selectively removed by photolithography so as to be left immediately above the region 20 between the half-buried dielectric films 5 and immediately above the portion of the half-buried dielectric film 5 on the region 20 side, and immediately above the channel region 6 and immediately above the portion of the STI 7 on the channel region 6 side. Thus, an electrode 8a is formed so as to overlap the half-buried dielectric film 5, and an electrode 8b is formed so as to overlap the STI 7.

Figure 6A:
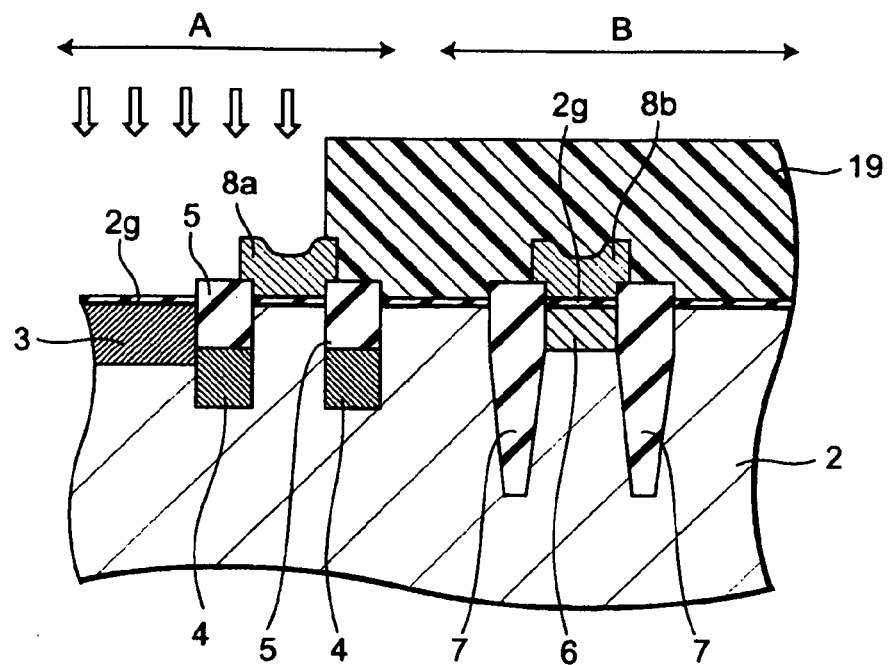
FIGS. 6A and 6B are process cross-sectional views illustrating a method for manufacturing the semiconductor device according to the first embodiment.

Next, as shown in FIG. 6A, a resist pattern 19 is formed on the semiconductor substrate 2 so as to cover the region B and expose the region A. Then, the resist pattern 19, the electrode 8a, and the half-buried dielectric film 5 are used as a mask to implant donor impurities to form an n-type region 3 in part of the upper portion of the semiconductor substrate 2 in the region A. Here, the n-type region 3 is formed in contact with the p-type region 4 formed immediately below the half-buried dielectric film 5 by the self-alignment process in which the half-buried dielectric film 5 serves as a mask. Subsequently, the resist pattern 19 is removed.

Figure 6B:
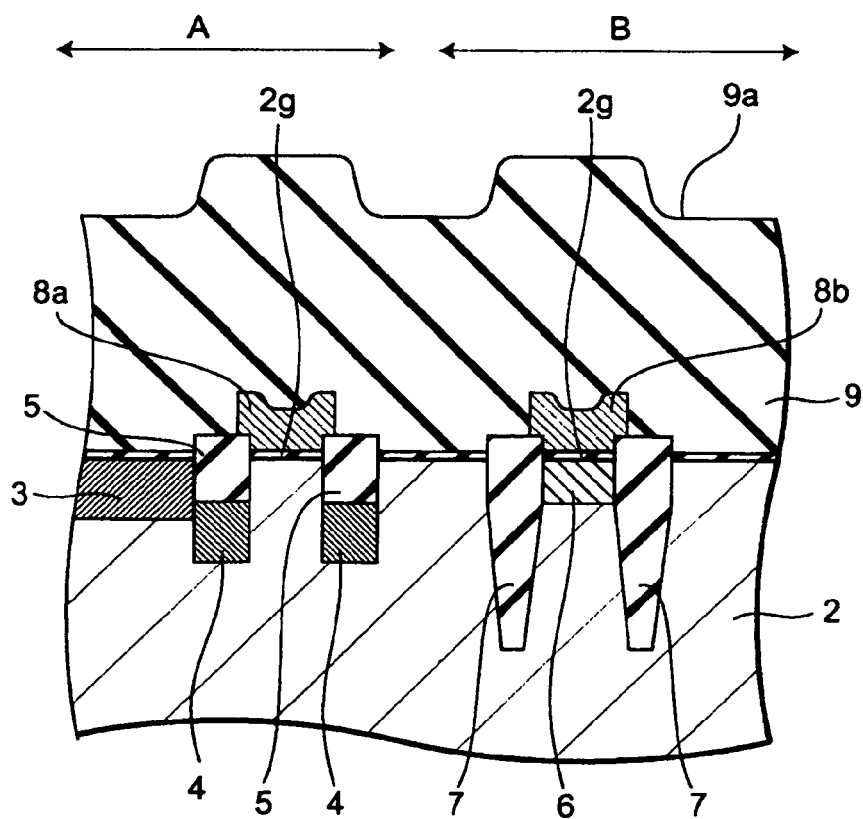

Next, as shown in FIG. 6B, a dielectric material is deposited on the semiconductor substrate 2 to form an interlayer dielectric film 9 covering the half-buried dielectric film 5, the STI 7, and the electrodes 8a and 8b. Here, the shape of the upper surface 9a of the interlayer dielectric film 9 reflects the shape of the electrodes 8a and 8b. That is, the upper surface 9a immediately above the electrodes 8a and 8b is projected from the surroundings with generally the same dimension.

Next, as shown in FIG. 1, CMP or other planarization processing is applied to planarize the upper surface 9a of the interlayer dielectric film 9. Then, the interlayer dielectric film 9 is processed by photolithography to form a contact hole immediately above each of the electrodes 8a and 8b. A conductive material is buried in the contact hole by being deposited on the entire surface and then planarized by CMP. Thus, contacts 10a and 10b are formed. Here, the contact 10a is connected to the electrode 8a, and the contact 10b is connected to the electrode 8b. Subsequently, an upper interconnect layer (not shown) is formed on the interlayer dielectric film 9. Thus, the semiconductor device 1 is manufactured.

Next, the function and effect of this embodiment are described.

As shown in FIG. 1, in the semiconductor device 1 according to this embodiment, the interface between the n-type region 3 and the p-type region 4 serves as a pn junction interface. Thus, the n-type region 3 is isolated from the region 20 by the p-type region 4 and the half-buried dielectric film 5. Furthermore, the n-type region 3 is insulated also from the electrode 8a by the half-buried dielectric film 5. On the other hand, the PMOS including the channel region 6 is isolated by the STI 7 from other elements formed in the semiconductor substrate 2. In this embodiment, the lower portion of the half-buried dielectric film 5 is buried in the semiconductor substrate 2. Hence, the amount of protrusion of the half-buried dielectric film 5 can be reduced while allowing the half-buried dielectric film 5 to be thick enough for the characteristics and the manufacturing process of the semiconductor device 1. Consequently, the height of the upper surface 5a of the half-buried dielectric film 5 can be made generally the same as the height of the upper surface 7a of the STI 7. By way of example, with reference to the upper surface 2a of the semiconductor substrate 2, the height of the upper surface 5a of the half-buried dielectric film 5 and the height of the upper surface 7a of the STI 7 are both 20 nm (nanometers).

Thus, the half-buried dielectric film 5 does not significantly protrude from the upper surface 2a of the semiconductor substrate 2, and the height of the upper surface 5a is generally the same as the height of the upper surface 7a. Hence, in the process shown in FIG. 5A, when the conductive film 18 is formed on the semiconductor substrate 2 so as to cover the half-buried dielectric film 5 and the STI 7, the upper surface 18a of the conductive film 18 immediately above the half-buried dielectric film 5 does not protrude from the surroundings, but has generally the same height as that immediately above the STI 7, even if the thickness of the conductive film 18 is not excessively large. Thus, the thickness of the conductive film 18 is generally uniform throughout the semiconductor device 1, and the upper surface 18a is generally flat.

The generally uniform thickness of the conductive film 18 and the generally flat upper surface 18a facilitate the processing in forming the electrodes 8a and 8b from the conductive film 18 in the process shown in FIG. 5B. That is, because the thickness of the conductive film 18 is generally uniform, the timing of etching termination for the conductive film 18 around the electrode 8a generally coincides with that around the electrode 8b. Furthermore, the thickness of the electrode 8a and the thickness of the electrode 8b can be generally equalized. Moreover, because the upper surface 18a is flat, the resist pattern used to process the conductive film 18 can be thinned, and the electrodes 8a and 8b can be finely formed.

Because the thickness of the electrode 8a is generally equal to that of the electrode 8b, in the process shown in FIG. 6B, when the interlayer dielectric film 9 is formed, the height of its upper surface 9a immediately above the half-buried dielectric film 5 and that immediately above the STI 7 are generally equal to each other. Thus, macroscopically, the height of the upper surface 9a in the region A is generally equal to that in the region B, and the upper surface 9a is generally flat throughout the semiconductor device 1. This facilitates CMP or other planarization for the upper surface 9a in the process shown in FIG. 1. Furthermore, there is no need to form the interlayer dielectric film 9 with an excessively large thickness before planarization, and hence the manufacturing cost can be reduced. Moreover, because the upper surface 9a is flat, the resist pattern used to process the interlayer dielectric film 9 can be thinned, and the contacts 10a and 10b can be finely formed. Consequently, in combination with the downscaling of the electrodes 8a and 8b, a fine semiconductor device 1 can be easily manufactured.

Next, a comparative example of this embodiment is described.

FIGS. 7A, 7B, 8A, and 8B are process cross-sectional views illustrating a method for manufacturing a semiconductor device according to this comparative example.

Figure 7A:
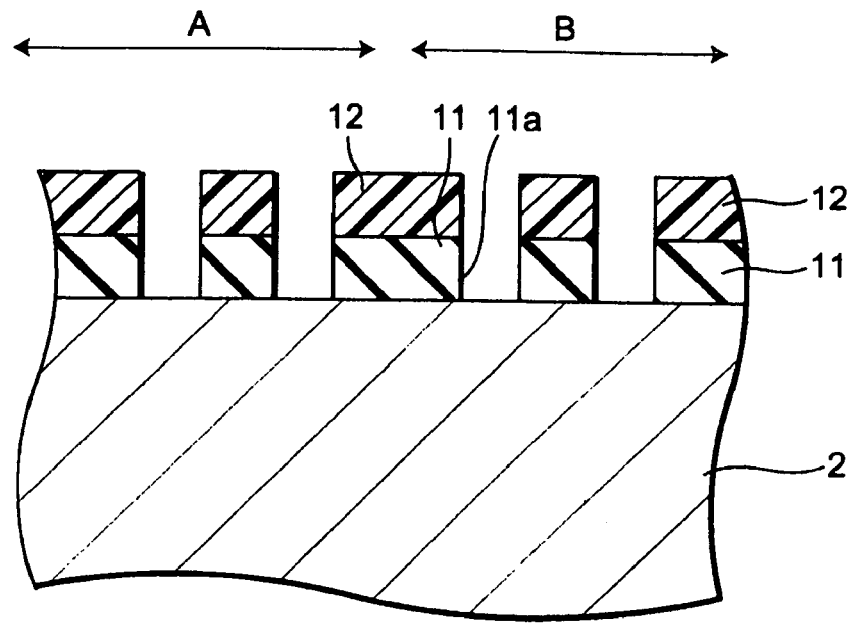
FIGS. 7A and 7B are process cross-sectional views illustrating a method for manufacturing a semiconductor device according to a comparative example of the first embodiment.

In this comparative example, a hard mask material film 11 and a resist pattern 12 are formed on a semiconductor substrate 2 as shown in FIG. 2A, and then the resist pattern 12 is used as a mask to perform dry etching as shown in FIG. 7A. Here, only the hard mask material film 11 is etched, and the semiconductor substrate 2 is not etched. That is, no recess 2c (see FIG. 2B) is formed in the semiconductor substrate 2.

Figure 7B:
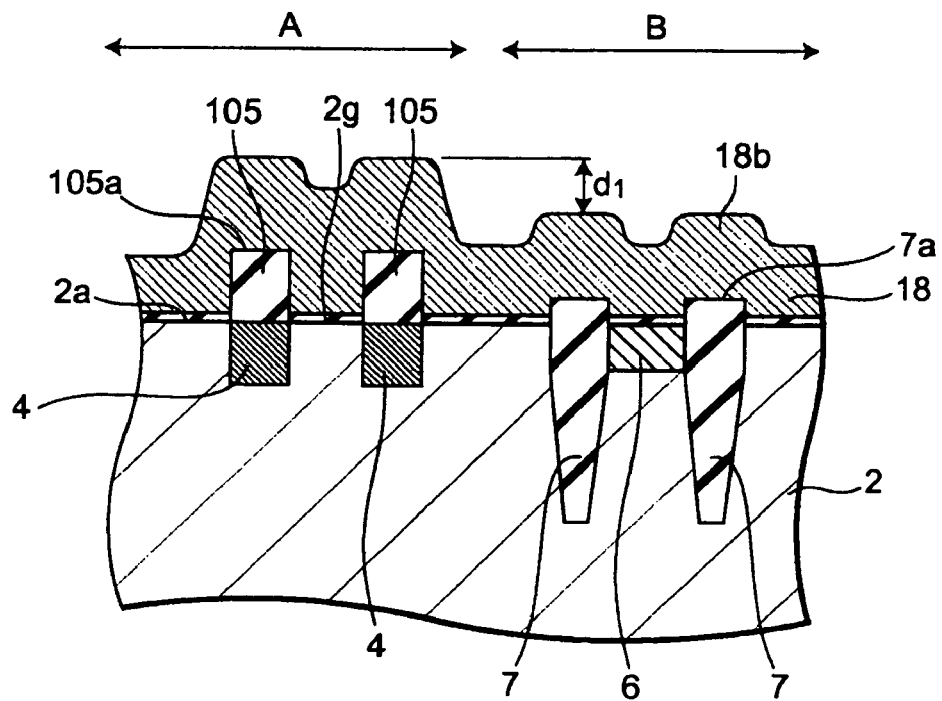

Next, the same processing as shown in FIGS. 2C to 4B is performed. Thus, as shown in FIG. 7B, a non-buried dielectric film 105 is formed in the region A, and a PMOS including STIs 7 and a channel region 6 is formed in the region B. In contrast to the half-buried dielectric film 5 (see FIG. 5A), the non-buried dielectric film 105 has no lower portion buried in the semiconductor substrate 2, and is entirely located above the upper surface 2a of the semiconductor substrate 2. Hence, the height of the upper surface 105a of the non-buried dielectric film 105 is higher than the height of the upper surface 7a of the STI 7. By way of example, with reference to the upper surface 2a of the semiconductor substrate 2, the height of the upper surface 105a of the non-buried dielectric film 105 is 60 nm, whereas the height of the upper surface 7a of the STI 7 is 20 nm, making a difference of 40 nm. In this situation, if a conductive film 18 is formed on the semiconductor substrate 2, the height of the upper surface 18a of the conductive film 18 immediately above the non-buried dielectric film 105 is higher than that immediately above the STI 7. In the above example, the height difference $d_1$ is approximately 40 nm.

Figure 8A:
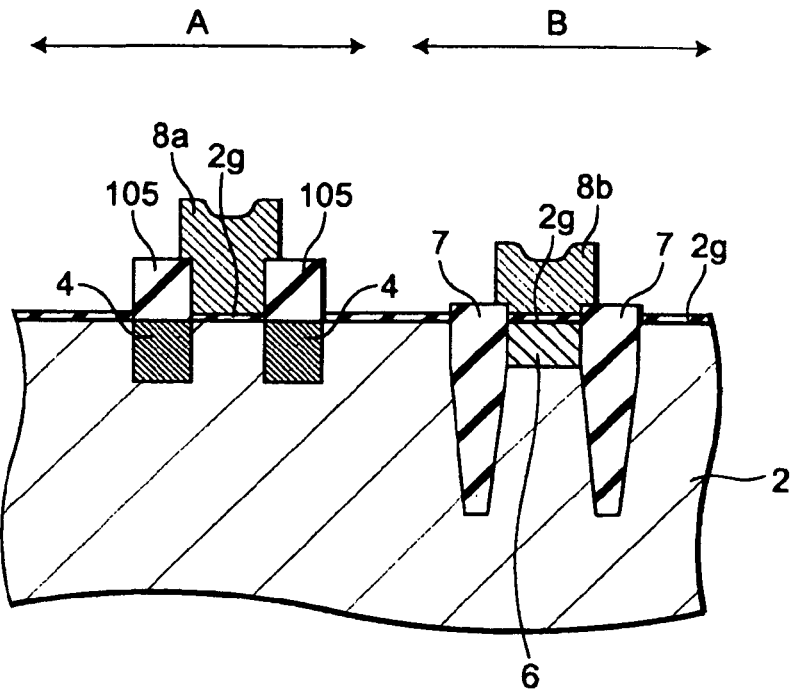
FIGS. 8A and 8B are process cross-sectional views illustrating a method for manufacturing a semiconductor device according to a comparative example of the first embodiment.

Next, the same processing as shown in FIG. 5B is performed to pattern the conductive film 18. Thus, as shown in FIG. 8A, electrodes 8a and 8b are formed on the non-buried dielectric film 105 and the STI 7, respectively. Here, the upper surface of the electrode 8a is higher than the upper surface of the electrode 8b. Next, as shown in FIG. 6A, the resist pattern 19, the electrode 8a, and the non-buried dielectric film 105 (see FIG. 8A) are used as a mask to implant donor impurities. Thus, an n-type region 3 is formed in the region A.

Figure 8B:
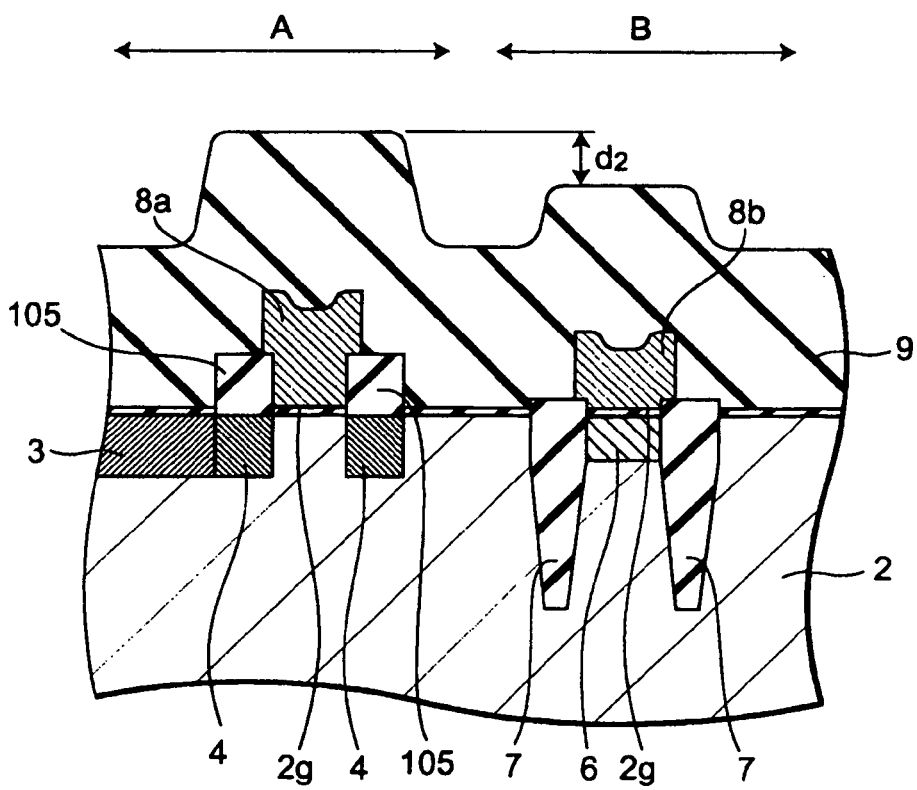

Next, as shown in FIG. 8B, an interlayer dielectric film 9 is formed on the semiconductor substrate 2 so as to cover the non-buried dielectric film 105 and the STI 7. Here, the height of the upper surface 9a of the interlayer dielectric film 9 immediately above the non-buried dielectric film 105 is higher than that immediately above the STI 7. In the above example, the height difference $d_2$ is approximately 40 nm.

In this comparative example, as described above, in the process shown in FIG. 7B, the height of the upper surface 18a of the conductive film 18 immediately above the non-buried dielectric film 105 is higher than that immediately above the STI 7. Hence, when the conductive film 18 is etched to form the electrodes 8a and 8b, the timing of etching termination around the electrode 8a is different from that around the electrode 8b. Consequently, etching performed around the electrode 8a enough to avoid residues of the conductive material results in overetching around the electrode 8b, which degrades the shape of the electrode 8b. On the other hand, the timing of etching termination adapted to the electrode 8b results in residues around the electrode 8a. Furthermore, because accurate etching cannot be performed, it is difficult to finely form the electrodes 8a and 8b.

Furthermore, in this comparative example, in the process shown in FIG. 8B, the height of the upper surface 9a of the interlayer dielectric film 9 immediately above the non-buried dielectric film 105 is higher than that immediately above the STI 7. Thus, macroscopically, the height of the upper surface 9a in the region A is higher than the height of the upper surface 9a in the region B. Consequently, even if CMP or other planarization is applied to the interlayer dielectric film 9, it is difficult to eliminate the height difference $d_2$ of the upper surface 9a between the region A and the region B.

The height difference remaining in the upper surface 9a increases the difficulty of the subsequent processes. For example, the difficulty of CMP for the conductive material film in forming the contacts 10a and 10b in the interlayer dielectric film 9 increases, and the conductive material is left as residues. Furthermore, because of difficulty in fine photolithography, the contacts 10a and 10b cannot be finely formed. On the other hand, if the interlayer dielectric film 9 is thickly formed to minimize the height difference $d_2$ of the upper surface 9a, it is difficult to reduce the profile of the semiconductor device. Thus, it is more difficult to downscale the semiconductor device in this comparative example than in the above first embodiment.

Next, a second embodiment of the invention is described.

Figure 9:
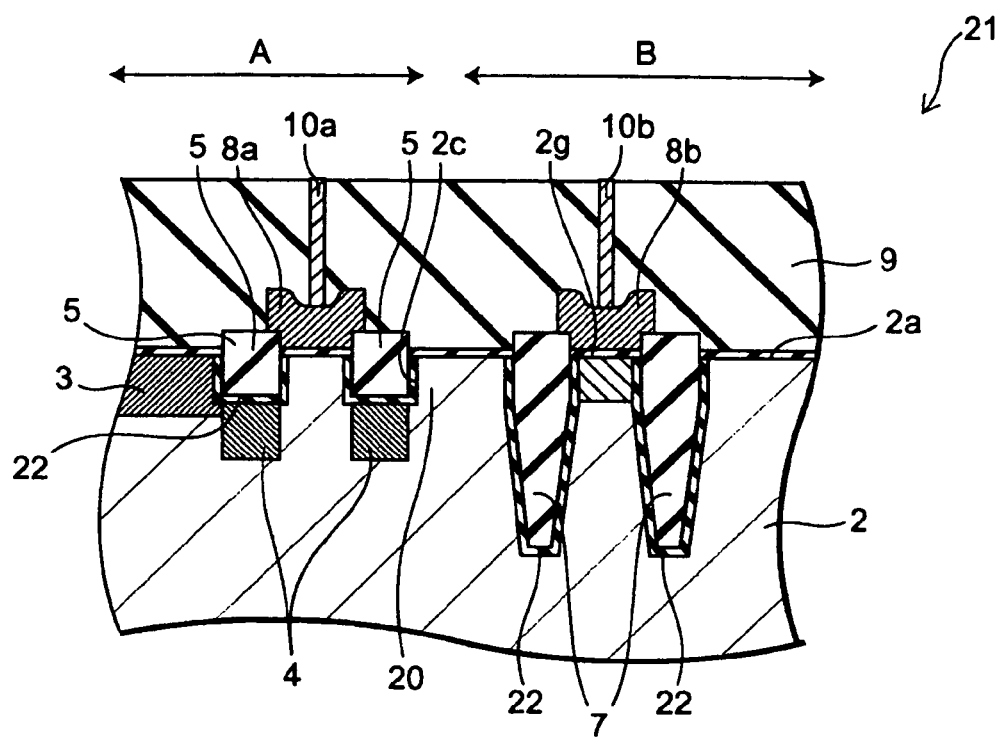
FIG. 9 is a cross-sectional view illustrating a semiconductor device according to a second embodiment of the invention.

FIG. 9 is a cross-sectional view illustrating a semiconductor device according to this embodiment.

As shown in FIG. 9, in addition to the configuration of the semiconductor device 1 (see FIG. 1) according to the above first embodiment, the semiconductor device 21 according to this embodiment includes a buffer dielectric film 22 so as to cover the lower portion of the half-buried dielectric film 5, that is, the portion buried in the semiconductor substrate 2. The buffer dielectric film 22 is made of a dielectric material that is different from that of the half-buried dielectric film 5. For example, the half-buried dielectric film 5 is formed from silicon oxide ($SiO_2$) deposited by HDP-CVD (high density plasma chemical vapor deposition), whereas the buffer dielectric film 22 is formed from silicon nitride (SiN). The configuration in this embodiment other than the foregoing is the same as that in the above first embodiment.

In this embodiment, the buffer dielectric film 22 provided between the half-buried dielectric film 5 and the semiconductor substrate 2 can serve to relieve the stress generated between the half-buried dielectric film 5 and the semiconductor substrate 2. For example, the half-buried dielectric film 5 formed by deposition of silicon oxide by HDP-CVD generates a large tensile stress inside the half-buried dielectric film 5. On the other hand, the buffer dielectric film 22 formed from silicon nitride generates a compressive stress inside the buffer dielectric film 22. Thus, the tensile stress inside the half-buried dielectric film 5 and the compressive stress inside the buffer dielectric film 22 are canceled out. Consequently, stress concentration at the corner of the half-buried dielectric film 5 is relieved, and the characteristics of the semiconductor device 21 can be made more favorable and stable. The operation and effect in this embodiment other than the foregoing are the same as those in the above first embodiment.

Next, a method for manufacturing the semiconductor device 21 according to this embodiment is described.

Figure 10A:
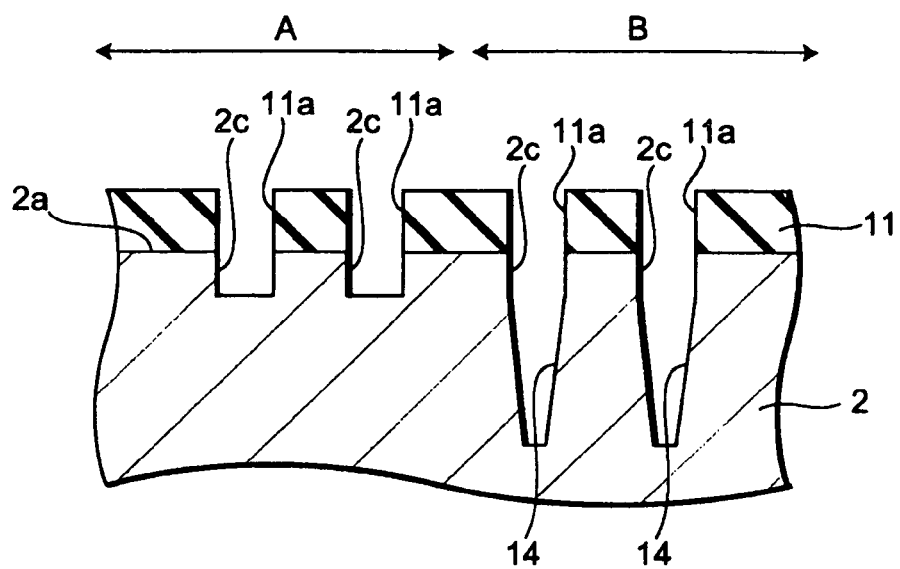
FIGS. 10A to 10C are process cross-sectional views illustrating a method for manufacturing the semiconductor device according to the second embodiment.
Figure 10B:
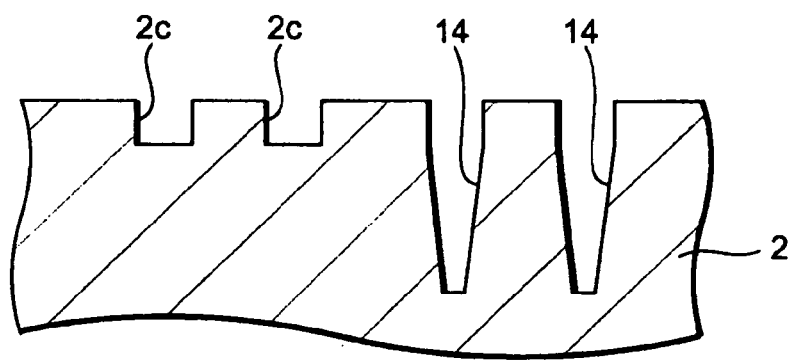
Figure 10C:
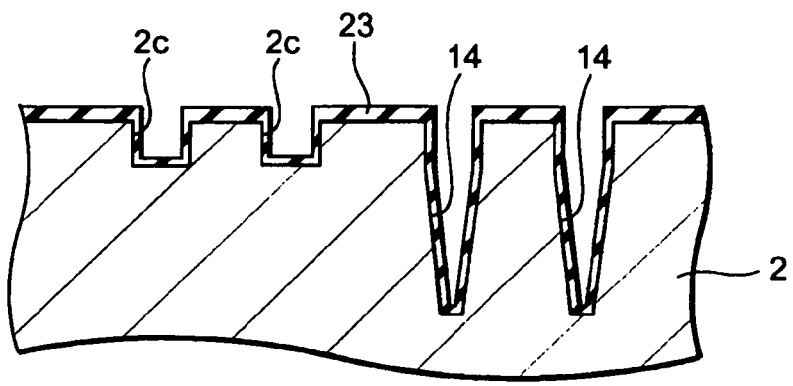

FIGS. 10A to 10C are process cross-sectional views illustrating the method for manufacturing the semiconductor device according to this embodiment.

In the following, the method for manufacturing the semiconductor device according to this embodiment is described with reference to the method for manufacturing the semiconductor device according to the above first embodiment.

First, the process shown in FIGS. 2A to 2C is performed. More specifically, a hard mask dielectric film 11 is formed on a semiconductor substrate 2 and used as a mask to form a recess 2c and a trench 14. Thus, as shown in FIG. 10A, in the structure thus fabricated, the hard mask dielectric film 11 is provided on the semiconductor substrate 2, and the recess 2c and the trench 14 are formed immediately below the openings 11a of the hard mask dielectric film 11. Here, the hard mask dielectric film 11 is not formed inside the recess 2c and the trench 14.

Next, as shown in FIG. 10B, the hard mask dielectric film 11 is removed. Then, as shown in FIG. 10C, a hard mask material film 23 is newly deposited on the entire upper surface of the semiconductor substrate 2. The hard mask material film 23 is formed from silicon nitride (SiN), and its thickness corresponds to the protrusion height of the STI 7 (see FIG. 9) from the upper surface 2a of the semiconductor substrate 2. Here, the hard mask material film 23 is formed not only on the semiconductor substrate 2, but also on the inner surface of the recess 2c and the inner surface of the trench 14.

Next, the process shown in FIGS. 3A to 7B is performed. Here, the hard mask material film 23 is used instead of the hard mask material film 11 in the first embodiment. Thus, as shown in FIG. 9, the hard mask material film 23 remaining in the recess 2c and the trench 14 serves as a buffer dielectric film 22. Thus, the semiconductor device 21 is manufactured.

Next, a third embodiment of the invention is described.

The semiconductor device according to this embodiment is a CMOS image sensor.

Figure 11:
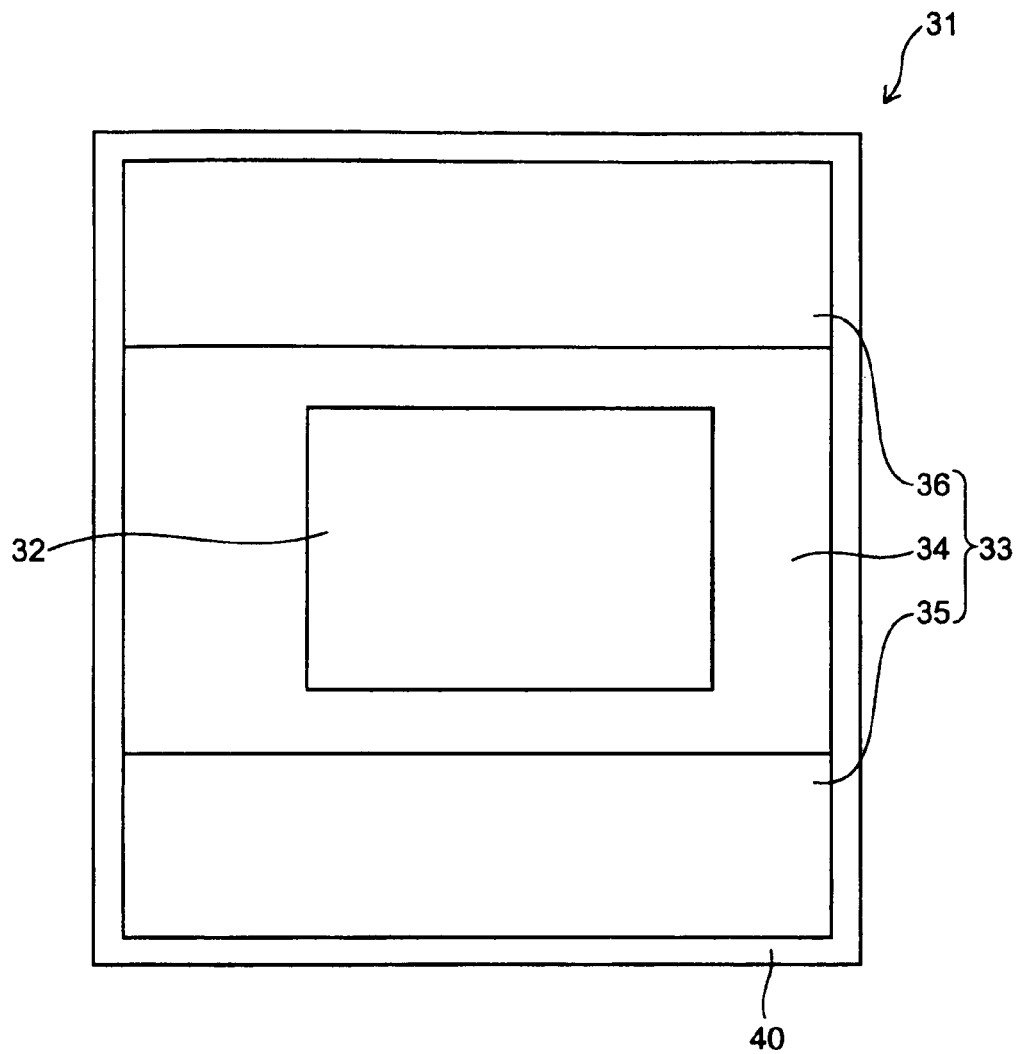
FIG. 11 is a plan view illustrating the semiconductor device according to the second embodiment of the invention.

FIG. 11 is a plan view illustrating the semiconductor device according to this embodiment.

Figure 12:
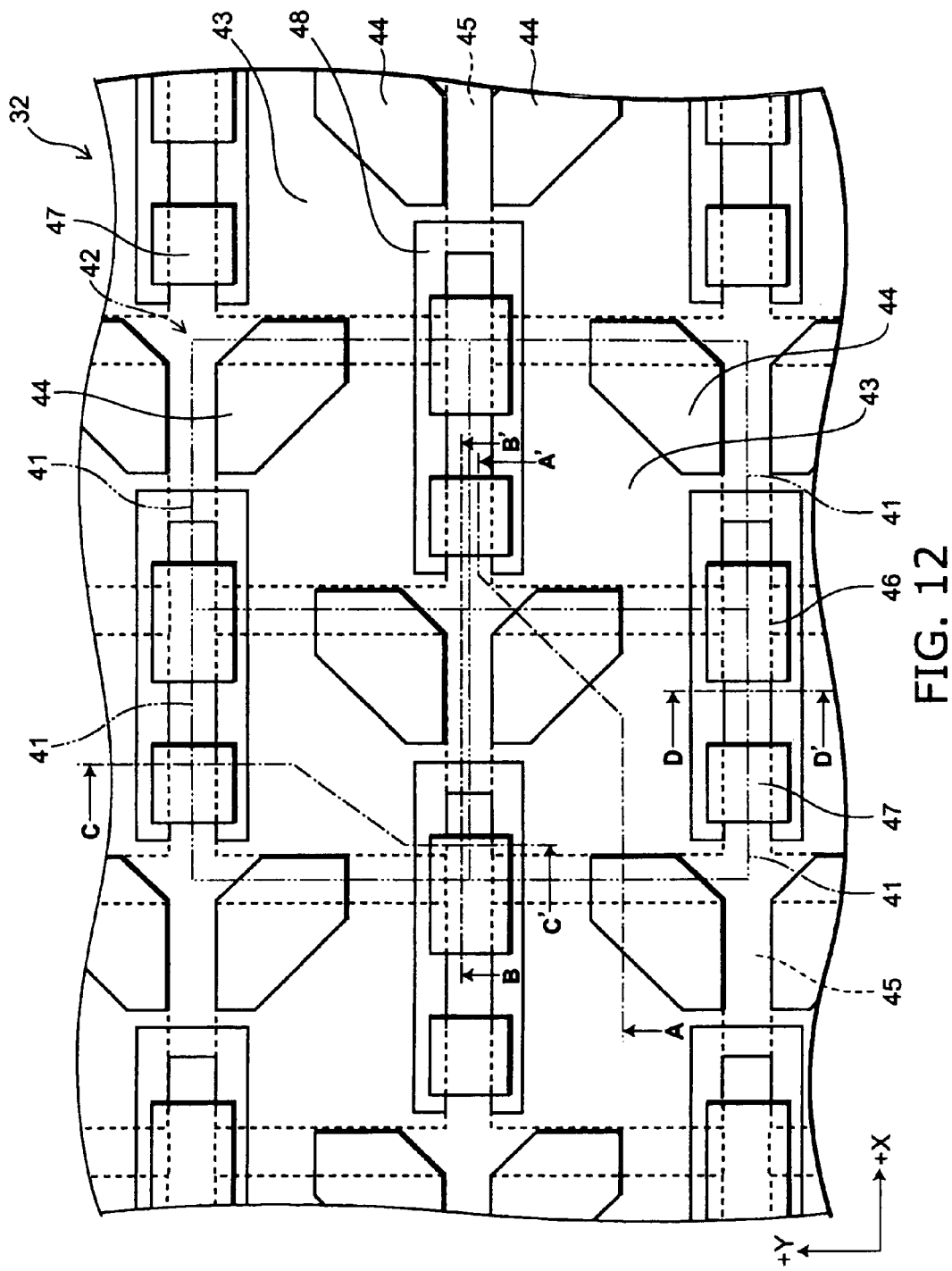
FIG. 12 is a plan view illustrating the imaging region shown in FIG. 11.

FIG. 12 is a plan view illustrating the imaging region shown in FIG. 11.

Figure 13:
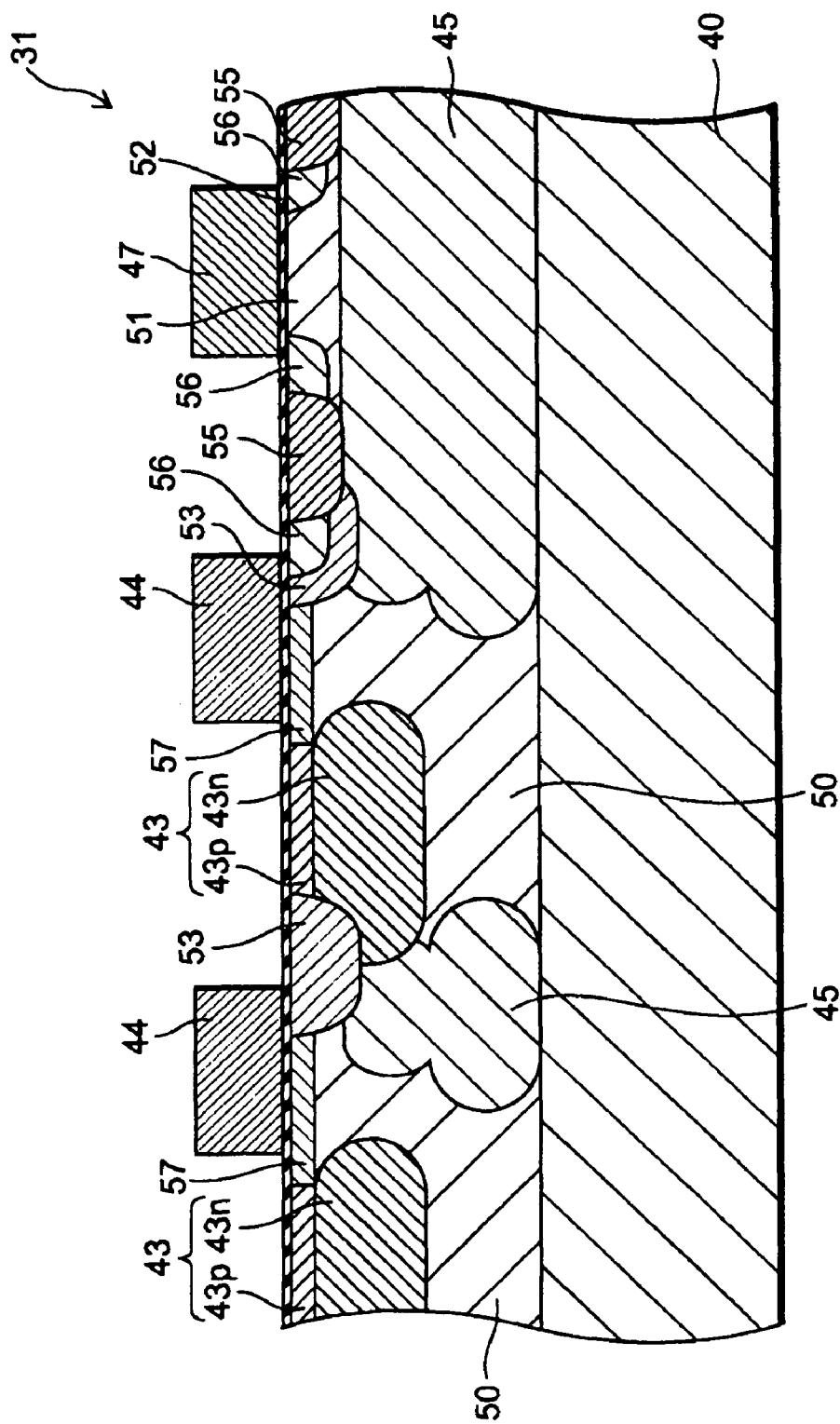
FIG. 13 is a cross-sectional view taken along line A-A' shown in FIG. 12.

FIG. 13 is a cross-sectional view taken along line A-A' shown in FIG. 12.

Figure 14:
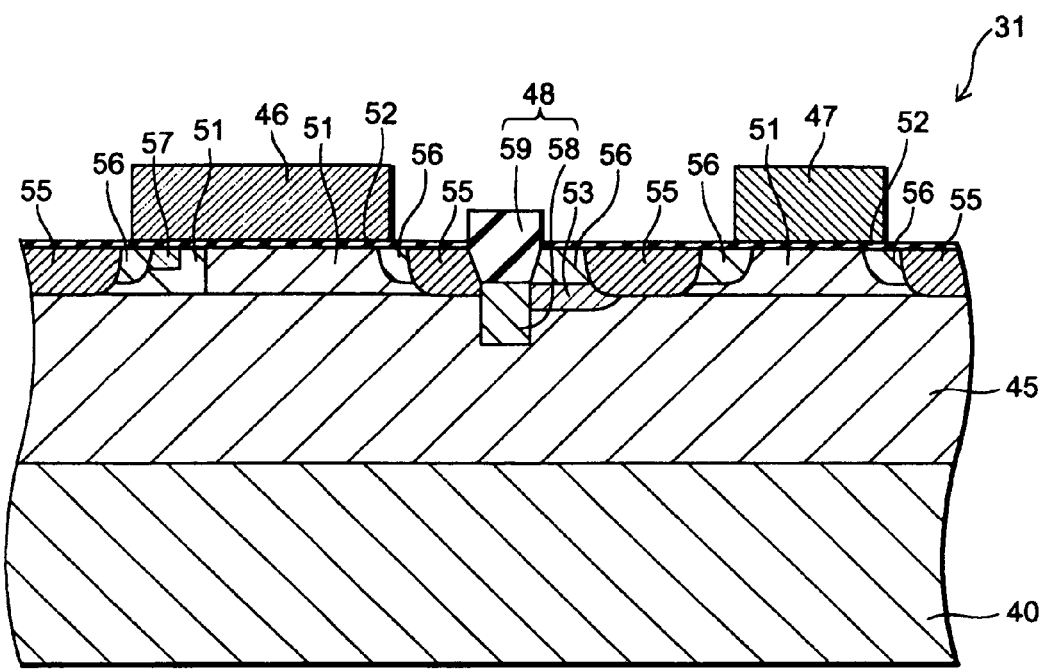
FIG. 14 is a cross-sectional view taken along line B-B' shown in FIG. 12.

FIG. 14 is a cross-sectional view taken along line B-B' shown in FIG. 12.

Figure 15:
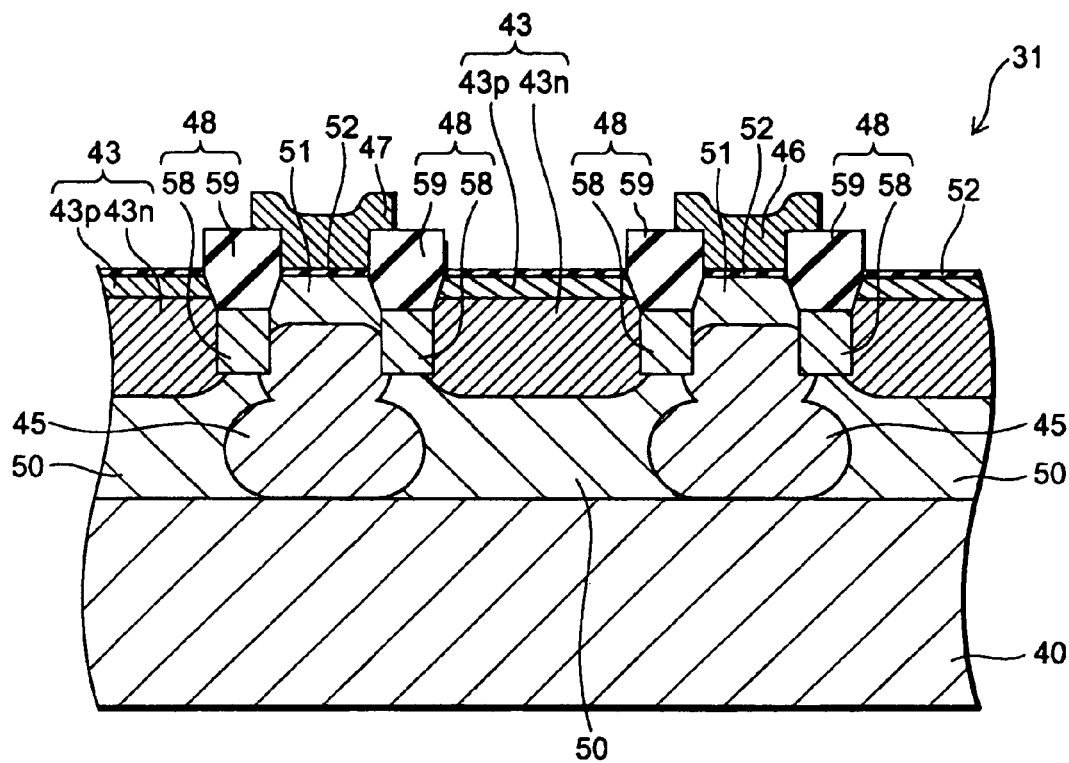
FIG. 15 is a cross-sectional view taken along line C-C' shown in FIG. 12.

FIG. 15 is a cross-sectional view taken along line C-C' shown in FIG. 12.

Figure 16:
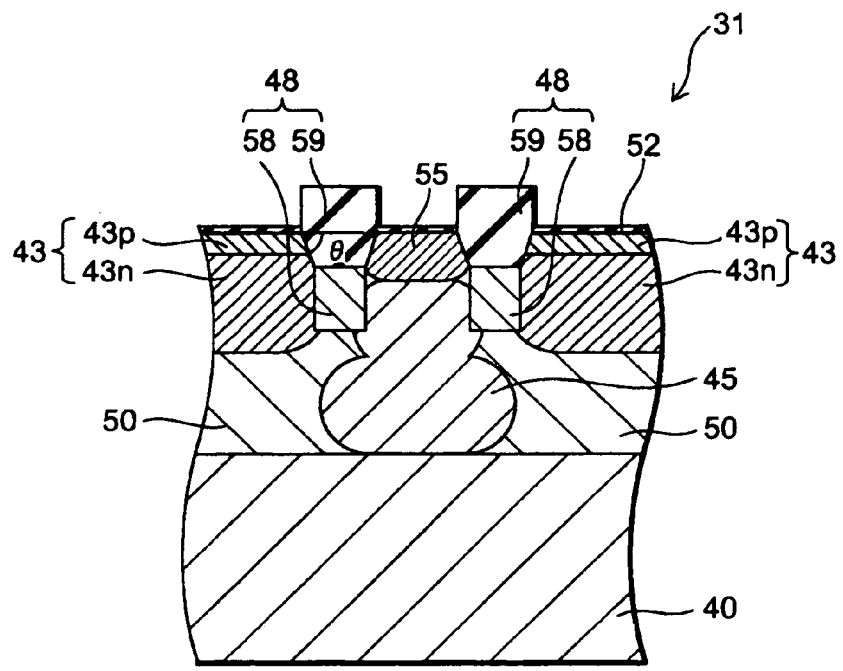
FIG. 16 is a cross-sectional view taken along line D-D' shown in FIG. 12.

FIG. 16 is a cross-sectional view taken along line D-D' shown in FIG. 12.

Figure 17:
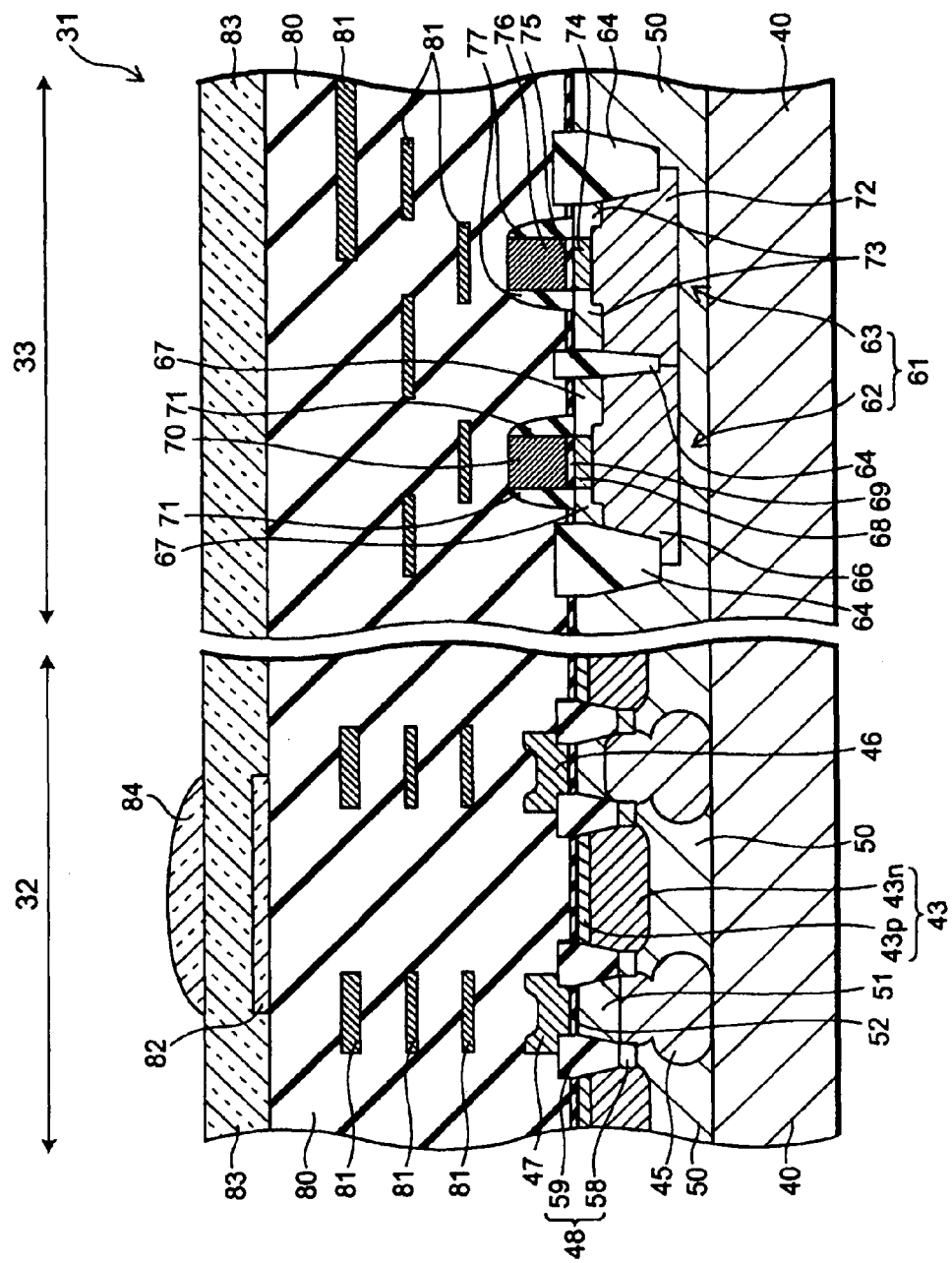
FIG. 17 is a cross-sectional view schematically illustrating the imaging region and the processing region shown in FIG. 11.

FIG. 17 is a cross-sectional view schematically illustrating the imaging region and the processing region shown in FIG. 11. As shown in FIG. 11, in the CMOS image sensor 31 according to this embodiment, an imaging region 32 for converting incident light to an electrical signal is provided at the center of a silicon substrate 40. Furthermore, a processing region 33 for processing the electrical signal outputted from the imaging region 32 is provided around the imaging region 32. In the processing region 33, a peripheral circuit region 34 for retrieving an electrical signal from the imaging region 32 is provided in a frame-shaped region surrounding the imaging region 32. On one side of the peripheral circuit region 34 in the processing region 33 is provided an image processing circuit region 35 for performing image processing based on the electrical signal, and on the other side of the peripheral circuit region 34 is provided an image compressing circuit region 36 for compressing the image.

As shown in FIG. 12, in the imaging region 32, as viewed from above, a plurality of pixels 41 are arranged in a matrix configuration. Four pixels 41 arranged in two rows and two columns constitute one cell 42. Each pixel 41 belonging to one cell 42 illustratively includes a color filter 82 (see FIG. 17) of red, green, blue, and blue. In the following, in this embodiment, for convenience of description, the arrangement directions of the pixels 41 are referred to as X direction and Y direction.

Each pixel 41 includes a photodiode 43 for converting incident light to charge. Furthermore, each pixel 41 includes a transfer gate 44. The transfer gate 44 is placed at one corner of the pixel 41 and shaped like a parallel hexagon, which is formed by cutting off the three corners of a right triangle along the corner of the pixel 41. In the imaging region 32, the pixels 41 with the transfer gate 44 placed at the +X+Y corner and pixels 41 with the transfer gate 44 placed at the +X−Y corner are alternately arranged along the X direction and the Y direction.

The pixels 41 are isolated by a barrier region 45 formed like a lattice. Of the regions in the barrier region 45 corresponding to the lattice points, a rectangular reset gate 46 is provided in the region including a portion immediately above the region corresponding to the lattice point not adjacent to the corner populated with the transfer gate 44. Furthermore, at a position spaced from the reset gate 46 in the −X direction by a distance of less than one pixel, a rectangular amplifier gate 47 is provided. Moreover, a mesa isolation region 48 shaped like a square U as viewed from above is formed so as to surround the reset gate 46 and the amplifier gate 47 along the portion of the barrier region 45 extending in the X direction. The square U shape in each mesa isolation region 48 opens to the –X direction.

As shown in FIGS. 12 to 16, in the CMOS image sensor 31, an n-type epitaxial layer 50 is formed on a p-type silicon substrate 40 containing boron (B). The silicon substrate 40 and the epitaxial layer 50 constitute a semiconductor substrate. Furthermore, a gate oxide film 52 is formed on the epitaxial layer 50. The photodiode 43, the barrier region 45, and the mesa isolation region 48 described above are formed in the epitaxial layer 50. On the other hand, the transfer gate 44, the reset gate 46, and the amplifier gate 47 described above are placed above the epitaxial layer 50 and the gate oxide film 52.

The photodiode 43 is composed of an n-type light receiving region 43n (first-conductivity-type region) formed in an upper portion of the epitaxial layer 50 and a p-type inversion layer 43p formed in the most superficial portion of the light receiving region 43n. Light incident on the light receiving region 43n generates charge. The inversion layer 43p serves to prevent excessive charge from occurring at the surface of the light receiving region 43n.

As described above, the barrier region 45 isolates the pixels 41 from each other. In the barrier region 45, an ion implantation layer formed by ion implantation of boron from the frontside is connected to a diffusion layer formed by diffusion of boron from the silicon substrate 40. That is, each pixel 41 is surrounded by the barrier region 45 and the silicon substrate 40 in a box configuration. However, the barrier region 45 is not exposed to the surface of the epitaxial layer 50, and a p-type pixel well 51 is formed between the barrier region 45 and the surface of the epitaxial layer 50. Furthermore, a p-type well 53 is formed in a region including a portion immediately below the edge of the transfer gate 44 adjacent to the barrier region 45, that is, the edge not opposed to the photodiode 43 belonging to the same pixel 41.

A pixel well 51 is placed immediately below the reset gate 46 in the epitaxial layer 50 and serves as a channel region. A pair of n-type source/drain regions 55 is formed at positions sandwiching this channel region in the X direction, and an n-type diffusion region 56 is formed around the source/drain region 55. The diffusion region 56 has a lower donor concentration and a smaller depth than the source/drain region 55. Likewise, a pixel well 51 is placed also immediately below the amplifier gate 47 and serves as a channel region, and a source/drain region 55 and a diffusion region 56 are formed on both sides thereof in the X direction. Furthermore, a p-type channel layer 57 is formed immediately below the transfer gate 44 in the most superficial portion of the epitaxial layer 50. Thus, a transistor structure is realized immediately below each gate.

The mesa isolation region 48 isolates the regions placed on both sides thereof and being in contact therewith from each other. Specifically, the mesa isolation region 48 isolates the photodiode 43 from the transistor structure formed immediately below each gate. That is, the mesa isolation region 48 isolates the photodiode 43 from the pixel well 51 as shown in FIG. 15, and isolates the photodiode 43 from the source/drain region 55 as shown in FIG. 16. In the mesa isolation region 48, a p-type region (second-conductivity-type region) 58 illustratively doped with boron is formed in the epitaxial layer 50, and a half-buried dielectric film 59 is formed immediately above the p-type region 58. A lower portion of the half-buried dielectric film 59 is buried in the epitaxial layer 50, and an upper portion of the half-buried dielectric film 59 protrudes from the upper surface of the epitaxial layer 50. The half-buried dielectric film 59 is illustratively formed from silicon oxide ($SiO_2$).

On the other hand, as shown in FIG. 17, the processing region 33 includes an analog circuit and a digital circuit, and a CMOS 61 is formed in part of the digital circuit. The CMOS 61 includes a P-channel MOSFET (PMOS) 62 and an N-channel MOSFET (NMOS) 63, and an STI 64 around the PMOS 62 and the NMOS 63. Thus, the PMOS 62 and the NMOS 63 are isolated from each other and from the surroundings by the STI 64. The STI 64 is illustratively formed from silicon oxide ($SiO_2$). The height of the upper surface of the STI 64 is generally equal to the height of the upper surface of the half-buried dielectric film 59. By way of example, the amount of protrusion of both the half-buried dielectric film 59 and the STI 64 from the epitaxial layer 50 is 20 nm.

In the PMOS 62, an N-well 66 is formed in an upper portion of the epitaxial layer 50. A pair of p-type source/drain regions 67 spaced from each other is formed in an upper portion of the N-well 66, and an n-type channel region 68 is formed between the source/drain regions 67. A gate dielectric film 69 and a gate electrode 70 are provided on the epitaxial layer 50 immediately above the channel region 68, and a sidewall 71 is provided on the lateral side of the gate electrode 70.

On the other hand, in the NMOS 63, a P-well 72 is formed in an upper portion of the epitaxial layer 50. A pair of n-type source/drain regions 73 spaced from each other is formed in an upper portion of the P-well 72, and a p-type channel region 74 is formed between the source/drain regions 73. A gate dielectric film 75 and a gate electrode 76 are provided on the epitaxial layer 50 immediately above the channel region 74, and a sidewall 77 is provided on the lateral side of the gate electrode 76.

Furthermore, above the epitaxial layer 50, an interlayer dielectric film 80 is provided throughout the imaging region 32 and the processing region 33, and metal interconnects 81 are buried in the interlayer dielectric film 80 at a plurality of stages. However, the metal interconnect 81 is not placed immediately above the photodiode 43 in the imaging region 32. A color filter 82 is provided on the interlayer dielectric film 80 immediately above the photodiode 43. Furthermore, an overcoat layer 83 is provided on the interlayer dielectric film 80 and the color filter 82, and a microlens 84 is provided on the overcoat layer 83 immediately above the photodiode 43.

Next, the buried depth of the half-buried dielectric film 59 is described.

Figure 18:
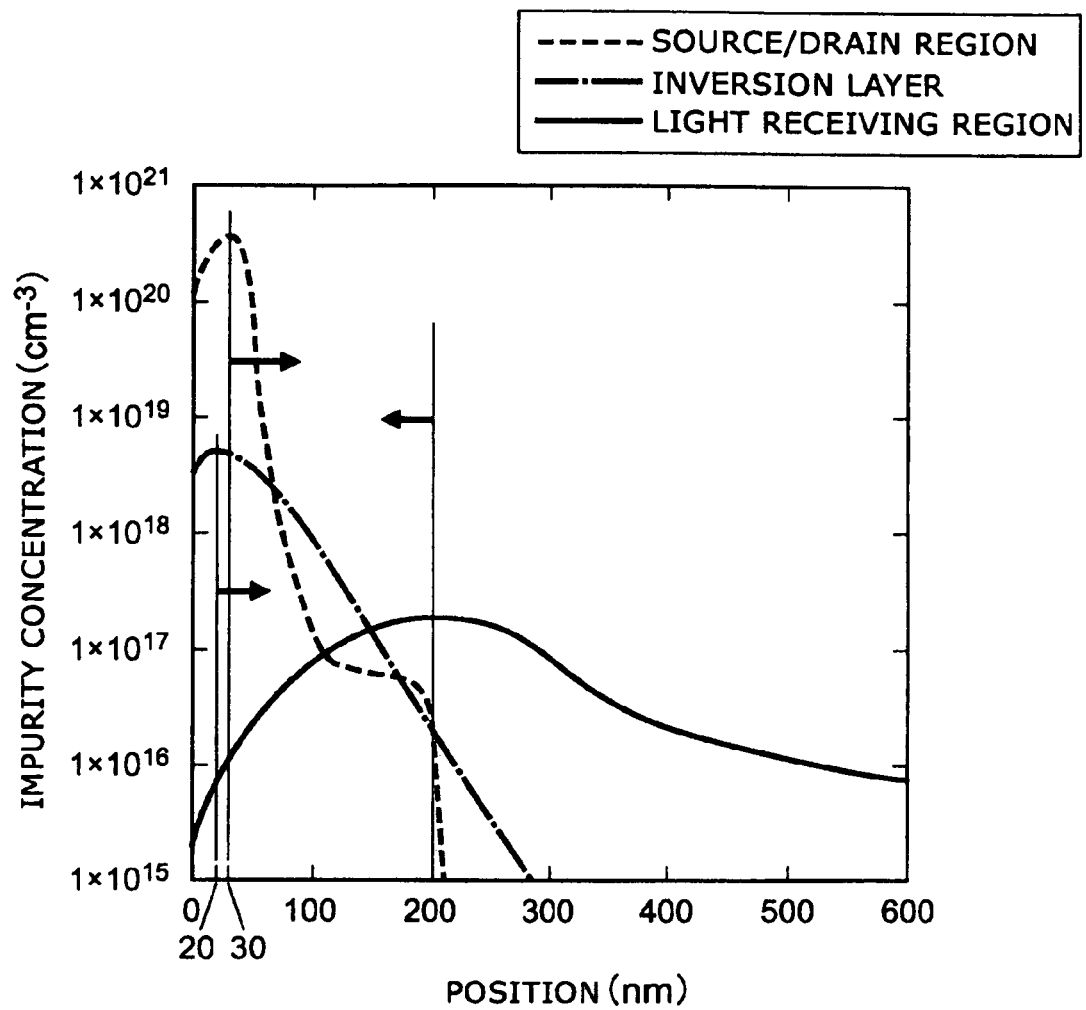
FIG. 18 is a graph illustrating the impurity concentration profile of the light receiving region, the inversion layer, and the source/drain region.

FIG. 18 is a graph illustrating the impurity concentration profile of the light receiving region, the inversion layer, and the source/drain region, where the horizontal axis represents the position along the depth, and the vertical axis represents impurity concentration. On the horizontal axis of FIG. 18, the position of the upper surface of the epitaxial layer 50 is set as the reference (0 μm).

As shown in FIGS. 16 and 18, the buried depth of the half-buried dielectric film 59, that is, the position of the lower surface of the half-buried dielectric film 59, preferably satisfies the following three requirements (1) to (3).

(1) The lower surface of the half-buried dielectric film 59 is located below the position (hereinafter referred to as "inversion layer depth") where the acceptor concentration is maximized in the acceptor concentration profile along the depth of the inversion layer 43p. In the example shown in FIG. 18, the inversion layer depth is approximately 20 nm.

(2) The lower surface of the half-buried dielectric film 59 is located below the position (hereinafter referred to as "SD depth") where the impurity concentration is maximized in the impurity concentration profile along the depth of the source/drain region 55 adjacent to the half-buried dielectric film 59. In the example shown in FIG. 18, the SD depth is approximately 30 nm.

(3) The lower surface of the half-buried dielectric film 59 is located above the position (hereinafter referred to as "PD depth") where the donor concentration is maximized in the donor concentration profile along the depth of the light receiving region 43n. In the example shown in FIG. 18, the PD depth is approximately 20 nm.

In the following, the reason for the above requirements is described.

With regard to requirement (1):

As described above, the position of the upper surface of the half-buried dielectric film 59 is generally matched with the position of the upper surface of the STI 64. Hence, if the lower surface of the half-buried dielectric film 59 is located above the inversion layer depth, the half-buried dielectric film 59 is thinned. Then, when the half-buried dielectric film 59 is used as a mask to perform ion implantation to form the inversion layer 43p, impurities penetrate through the half-buried dielectric film 59. This results in charge leakage from the photodiode 43 toward the transistor structure, which is likely to cause color mixing.

With regard to requirement (2):

Like (1) described above, if the lower surface of the half-buried dielectric film 59 is located above the SD depth of the source/drain region 55, the half-buried dielectric film 59 is thinned. Then, when the half-buried dielectric film 59 is used as a mask to perform ion implantation to form the source/drain region 55, impurities penetrate through the half-buried dielectric film 59. This results in the degradation of element isolation capability.

To confirm this phenomenon, the half-buried dielectric film 59 with the amount of upward protrusion from the upper surface of the epitaxial layer 50 being 20 nm was formed with different buried depths. The half-buried dielectric film 59 and the amplifier gate 47 were used as a mask to perform ion implantation to form the source/drain region 55. Then, the leakage current at the pn junction interface was measured. The measurement result is shown in TABLE 1. After the measurement, the half-buried dielectric film 59 was stripped off, and the concentration of impurities introduced immediately below the half-buried dielectric film 59 was measured. The result is shown in FIG. 19.

Figure 19:
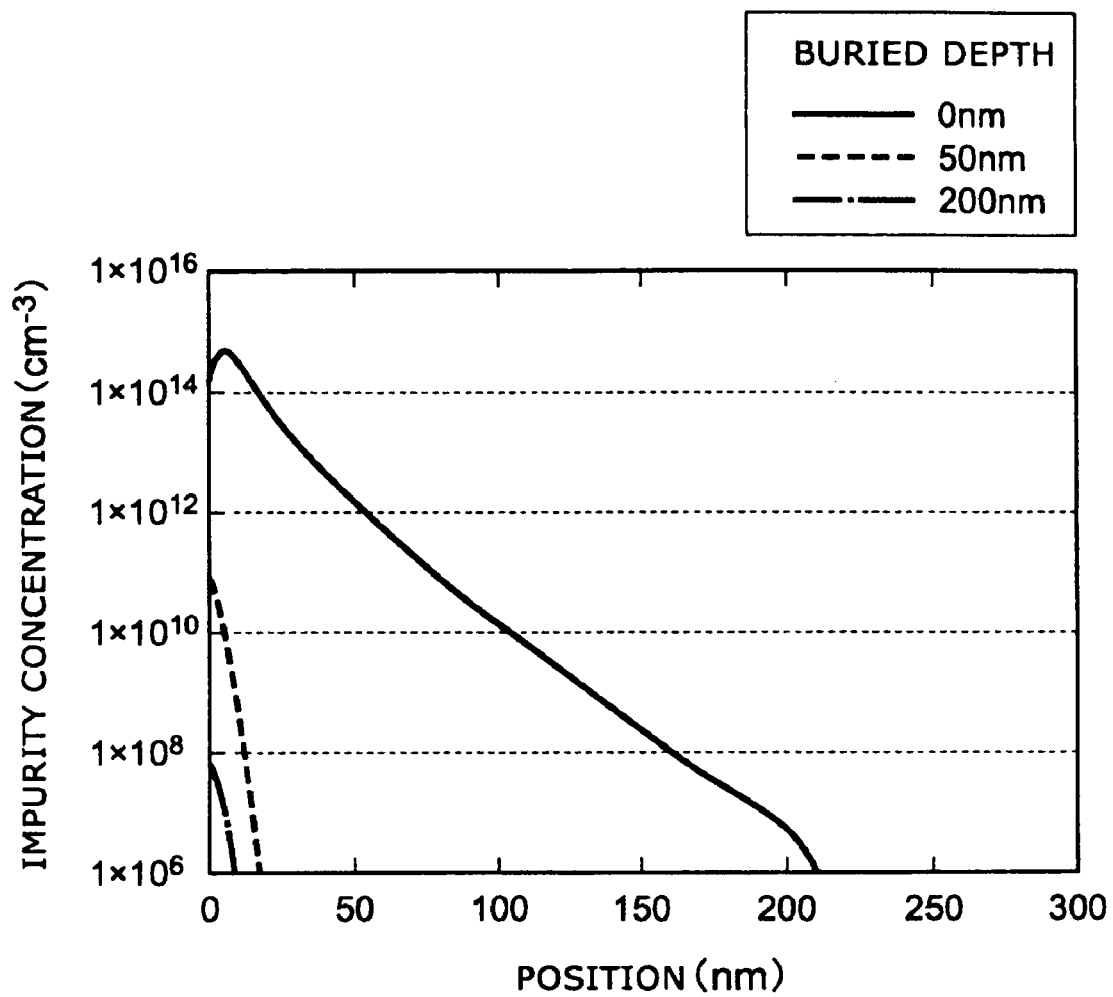
FIG. 19 is a graph illustrating the impurity concentration profile of the immediately underlying region of the half-buried dielectric film.

FIG. 19 is a graph illustrating the impurity concentration profile of the immediately underlying region of the half-buried dielectric film, where the horizontal axis represents the position along the depth, and the vertical axis represents impurity concentration. On the horizontal axis of FIG. 19, the position of the lower surface of the half-buried dielectric film is set as the reference (0 nm).

TABLE 1

| Buried depth of half-buried dielectric film (nm) | Leakage current (A) |
|---|---|
| 0 | $1 \times 10^{-7}$ |
| 20 | $1 \times 10^{-7}$ |
| 50 | $1 \times 10^{-16}$ |
| 200 | $1 \times 10^{-16}$ |

As shown in FIG. 19, when the buried depth of the half-buried dielectric film 59 was 0 nm, that is, the entire thickness of the half-buried dielectric film 59 was 20 nm, impurities were introduced immediately below the half-buried dielectric film 59 up to approximately $1 \times 10^{15}$ cm$^{-3}$. In contrast, when the buried depth of the half-buried dielectric film 59 was 50 nm, that is, the entire thickness of the half-buried dielectric film 59 was 70 nm, impurities were introduced immediately below the half-buried dielectric film 59 only up to approximately $1 \times 10^{11}$ cm$^{-3}$, which was approximately 1/10000 of that for a buried depth of 0 nm. Furthermore, when the buried depth of the half-buried dielectric film 59 was 200 nm, that is, the entire thickness of the half-buried dielectric film 59 was 220 nm, impurities were introduced immediately below the half-buried dielectric film 59 only up to approximately $1 \times 10^{8}$ cm$^{-3}$.

Thus, when the buried depth of the half-buried dielectric film 59 was shallower than the SD depth, such as 0 nm or 20 nm, impurities implanted for forming the source/drain region penetrated through the half-buried dielectric film 59 and caused a leakage current at the pn junction interface of the source/drain region. In contrast, when the buried depth of the half-buried dielectric film 59 was deeper than the SD depth, such as 50 nm or 200 nm, impurities scarcely penetrated through the half-buried dielectric film 59 and caused little leakage current. Hence, the lower surface of the half-buried dielectric film 59 is preferably located below the SD depth of the source/drain region 55 adjacent to the half-buried dielectric film 59.

With regard to requirement (3):

If the lower surface of the half-buried dielectric film 59 is located below the PD depth, the half-buried dielectric film 59 encroaches into the portion of the photodiode 43 having the maximum impurity concentration and significantly decreases the amount of impurities available for photoelectric conversion. Consequently, the sensitivity of the pixel decreases.

To confirm this phenomenon, an optical simulation was performed. This simulation assumed a half-buried dielectric film 59 having different buried depths with the amount of protrusion from the upper surface of the epitaxial layer 50 being 20 nm, and a photodiode 43 having a PD depth of 200 nm. The number of electrons, $Q_{sat}$, generated by photoelectric conversion in response to light incident on the photodiode was then calculated. The result is shown in TABLE 2, which also shows the percentage decrease of the number of electrons, $Q_{sat}$, with reference to the case where the buried depth is zero.

TABLE 2

| Buried depth of half-buried dielectric film (nm) | Number of electrons, $Q_{sat}$ | Percentage decrease of $Q_{sat}$ (%) |
|---|---|---|
| 0 | 5800 | 0.0 |
| 50 | 5700 | 1.7 |
| 200 | 2700 | 53.4 |

When the buried depth of the half-buried dielectric film 59 reached 200 nm, i.e., the PD depth, the number of electrons, $Q_{sat}$, significantly decreased. This is because, as described above, the half-buried dielectric film 59 formed to the PD depth encroached into the portion of the photodiode 43 having the maximum impurity concentration and significantly decreased the amount of impurities available for photoelectric conversion. Conversely, unless the lower surface of the half-buried dielectric film 59 reaches the PD depth, the number of electrons needed for photoelectric conversion does not excessively decrease. Hence, the lower surface of the half-buried dielectric film 59 is preferably located above the PD depth of the light receiving region 43n.

Thus, it is not preferable that the buried depth of the half-buried dielectric film 59 be too shallow or too deep, but the buried depth has a suitable range. That is, the thickness of the half-buried dielectric film 59 is preferably such that impurities implanted for forming the inversion layer and the source/drain region does not penetrate therethrough while the height of the upper surface of the half-buried dielectric film 59 is matched with the height of the upper surface of the STI 64, and the depth of the half-buried dielectric film 59 is preferably such that it does not encroach into the portion of the photodiode having high impurity concentration. Specifically, the lower surface of the half-buried dielectric film 59 is preferably located at a position satisfying (1) to (3) described above. It is noted that the inversion layer depth, the PD depth, and the SD depth described above are substantially left unchanged between at the time of impurity implantation and after the device completion. This is because diffusion of impurities by thermal history does not change the peak position, although broadening the peak of the profile.

Next, the taper angle of the half-buried dielectric film 59 is described.

As shown in FIG. 16, the taper angle θ is defined as the angle that the direction being parallel to the upper surface of the epitaxial layer 50 and directed from the outer edge of the half-buried dielectric film 59 to its center makes with the downward direction parallel to the side surface of the half-buried dielectric film 59. This taper angle θ is preferably 73° to 90°. If the taper angle θ exceeds 90°, the bottom of the recess formed in the upper surface of the epitaxial layer 50 is larger than its opening, making it difficult to bury the dielectric material therein.

On the other hand, if the taper angle θ is less than 90°, the cross section of the half-buried dielectric film 59 is shaped like a trapezoid with a long upper side and a short lower side, and the half-buried dielectric film 59 has a small thickness at its both end portions. Hence, when the half-buried dielectric film 59 is used as a mask to form the diffusion region (e.g., the source/drain region 55 shown in FIG. 14 or the light receiving region 43$n$ shown in FIG. 16), donor impurities implanted for forming the diffusion region penetrate through both end portions of the half-buried dielectric film 59. Consequently, the penetrated donor impurities cancel out the effect of the acceptor impurities contained in both end portions of the p-type region 58 and narrow the effective width of the p-type region 58. Furthermore, if the taper angle θ is less than 73°, the effective width of the p-type region 58 is too narrow, and the leakage current flowing through the p-type region 58 increases. This makes it difficult for the p-type region 58 to sufficiently isolate both sides thereof. By way of example, assume that the upper end portion of the half-buried dielectric film 59 has a width of 0.16 μm and a thickness of 55 nm. Then, if the taper angle θ is less than 73°, the width of the lower end portion of the half-buried dielectric film 59 is less than 0.12 μm, which increases the leakage current flowing through the p-type region 58.

Next, the operation of the CMOS image sensor 31 according to this embodiment is described.

When light is incident on the imaging region 32 from outside the CMOS image sensor 31, the light is collected by the microlens 84, transmitted through the overcoat layer 83, wavelength-selected while passing through the color filter 82, transmitted through the interlayer dielectric film 80, and incident on the photodiode 43. Thus, charge is generated and accumulated in the light receiving region 43$n$.

Then, the circuit in the peripheral circuit region 34 drives the transfer gate 44 so that the charge accumulated in the light receiving region 43$n$ is transferred through the channel layer 57 (see FIG. 13) to the transistor structure formed immediately below the amplifier gate 47, and retrieved as an electrical signal. Furthermore, the circuit in the peripheral circuit region 34 drives the reset gate 46 to eliminate the charge. The electrical signal retrieved by the amplifier gate 47 is processed by the processing region 33. More specifically, it is inputted through the peripheral circuit region 34 to the image processing circuit region 35, where image processing is applied thereto. Subsequently, the data is compressed in the image compressing circuit region 36 and outputted from the CMOS image sensor 31.

Next, a method for manufacturing the CMOS image sensor 31 according to this embodiment is described.

The method for manufacturing the CMOS image sensor 31 is the same in characteristic features as the method for manufacturing the semiconductor device according to the above first embodiment. More specifically, an epitaxial layer 50 is formed on a silicon substrate 40, and then a hard mask material film (not shown) is formed on the epitaxial layer 50. The hard mask material film is illustratively formed from silicon nitride (SiN). Next, by selective etching, an opening is formed in the hard mask material film in a region intended for a mesa isolation region 48 and a region intended for an STI 64, and a recess is formed in the upper surface of the epitaxial layer 50 immediately below the opening. Then, the hard mask material film is used as a mask to further process the recess of the processing region 33 to form a trench.

Next, the hard mask material film is used as a mask to implant boron or other acceptor impurities into the imaging region 32 to form a p-type region 58. Next, a dielectric material such as silicon oxide is deposited on the entire surface and etched back by wet etching to bury a half-buried dielectric film 59 in the recess of the imaging region 32 and an STI 64 in the trench of the processing region 33. Thus, the amount of protrusion of the half-buried dielectric film 59 can be reduced, and the height of the upper surface of the half-buried dielectric film 59 can be made generally equal to the height of the upper surface of the STI 64.

Subsequently, conventional methods are used to fabricate the other components in the CMOS image sensor 31. This process also includes the step of using the half-buried dielectric film 59 as a mask to implant phosphorus (P) or other donor impurities into the epitaxial layer 50 so that the light receiving region 43$n$ of the photodiode 43 is formed in a region adjacent to the p-type region 58 in a self-aligned manner. The transfer gate 44, the reset gate 46, and the amplifier gate 47 in the imaging region 32 and the gate electrode 70 and the gate electrode 76 in the processing region 33 are formed by processing the same polysilicon film.

Here, the height of the upper surface of the half-buried dielectric film 59 is low and generally the same as the height of the upper surface of the STI 64. Hence, on the same principle as described in the above first embodiment, the transfer gate 44, the reset gate 46, the amplifier gate 47, the gate electrode 70, and the gate electrode 76 can be easily formed, and the height of the upper surface of these gates can be made generally equal to each other. Furthermore, the height of the upper surface of the interlayer dielectric film 80 can be made generally equal between the imaging region 32 and the processing region 33. This decreases the difficulty of CMP for the interlayer dielectric film 80 and facilitates forming a fine structure. By the above method, the CMOS image sensor 31 is manufactured.

Next, the function and effect of this embodiment are described.

In this embodiment, isolation between the photodiode 43 and the transistor structure is implemented by the mesa isolation region 48. Thus, as compared with the case of implementing this isolation by STI, the area needed for isolation can be reduced. Consequently, the area of the photodiode 43 can be increased. This increases the number of saturated electrons during photoelectric conversion and improves the sensitivity, thereby enhancing the image characteristics.

In the following, this effect is described in detail.

Figure 20A:
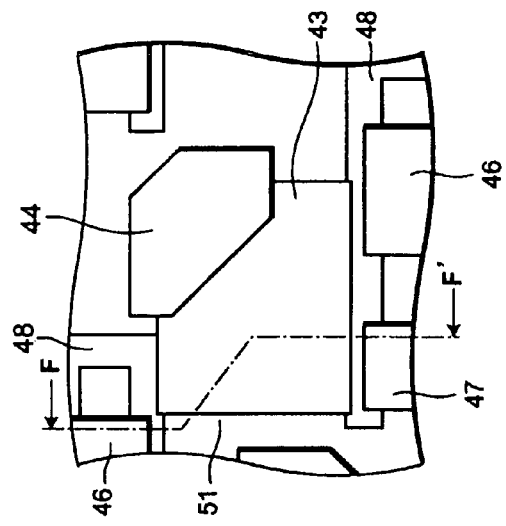
FIG. 20A is a plan view illustrating one pixel in a CMOS image sensor according to a comparative example of the second embodiment.
Figure 20C:
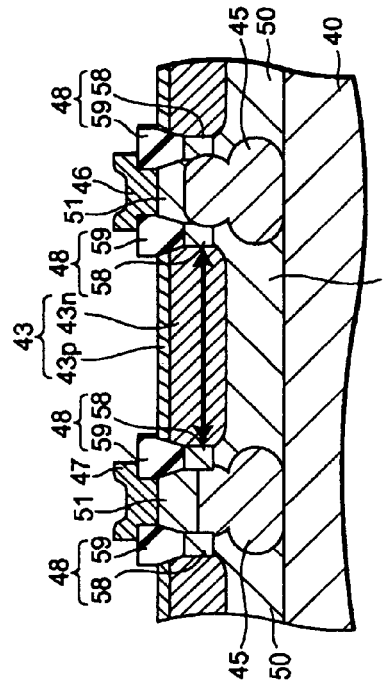
FIG. 20C is a plan view illustrating one pixel in the CMOS image sensor according to the second embodiment.
Figure 20B:
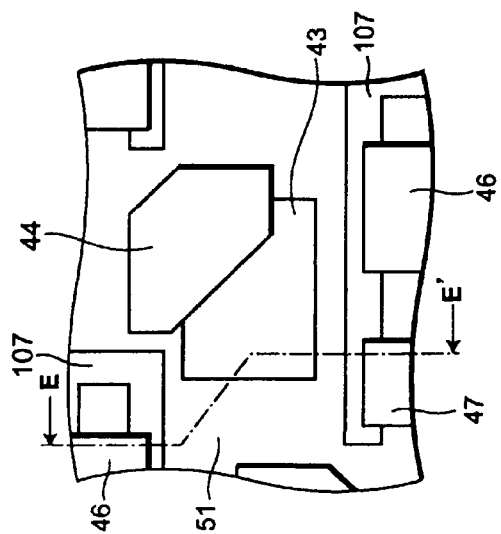
FIG. 20B is a cross-sectional view taken along line E-E' shown in FIG. 20A.
Figure 20D:
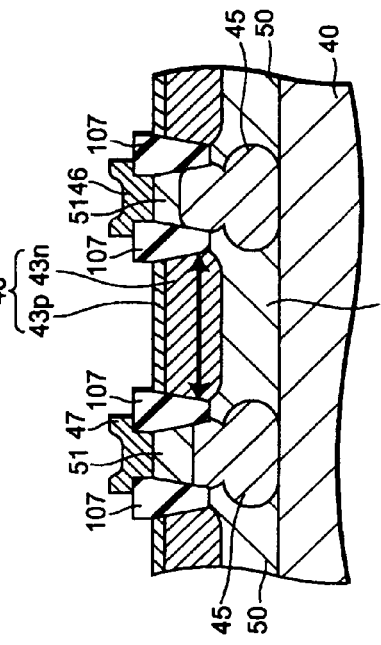
FIG. 20D is a cross-sectional view taken along line F-F' shown in FIG. 20C.

FIG. 20A is a plan view illustrating one pixel in a CMOS image sensor according to a comparative example of this embodiment, FIG. 20B is a cross-sectional view taken along line E-E' shown in FIG. 20A, FIG. 20C is a plan view illustrating one pixel in the CMOS image sensor according to this embodiment, and FIG. 20D is a cross-sectional view taken along line F-F' shown in FIG. 20C.

As shown in FIGS. 20A and 20B, in the comparative example of this embodiment, the photodiode 43 is isolated from the surrounding transistor structure by STIs 107. In this case, in association with the formation of the STI 107, crystal defects are introduced into the silicon substrate and generate unpaired electron pairs. Hence, the STI 107 needs to be enclosed by a pixel well 51. This decreases the area of the photodiode 43 by the margin of the pixel well 51.

In contrast, as shown in FIGS. 20C and 20D, in this embodiment, the photodiode 43 is isolated from the surrounding transistor structure by the mesa isolation structure 48 composed of the p-type region 58 and the half-buried dielectric film 59. Furthermore, the p-type region 58 is formed not only immediately below the half-buried dielectric film 59, but also formed thinly on the lateral side thereof (not shown). Hence, the half-buried dielectric film 59 can be thinly enclosed by the p-type region 58. Consequently, crystal defects introduced into the silicon substrate in association with the formation of the half-buried dielectric film 59 can be prevented from affecting photoelectric conversion of the photodiode 43. Hence, in contrast to the above comparative example, there is no need to place the pixel well 51 on the photodiode 43 side of the mesa isolation structure 48, and the area of the photodiode 43 can be increased by that amount. This increases the number of saturated electrons during photoelectric conversion and improves the sensitivity. Consequently, the performance of the CMOS image sensor 31 is enhanced.

By way of example, assuming the same size and shape of the pixel in the comparative example shown in FIGS. 20A and 20B and this embodiment shown in FIGS. 20C and 20D, the area of the photodiode is 0.41 $\mu m^2$ in the comparative example, and 0.72 $\mu m^2$ in this embodiment. That is, according to this embodiment, the area of the photodiode can be increased by a factor of approximately 1.76 relative to the comparative example.

Furthermore, in this embodiment, the mesa isolation structure is mixed with the STI. More specifically, as shown in FIG. 17, the photodiode 43 is isolated from the surrounding transistor structure by the mesa isolation structure 48 in the imaging region 32, whereas the CMOS 61 or other element is isolated by the STI 64 in the processing region 33. Hence, in the processing region 33, there is no need to change the conventional design rule and process. Thus, a reliable device can be fabricated easily and cost-effectively.

Furthermore, the lower portion of the half-buried dielectric film 59 constituting the mesa isolation structure 48 is buried in the epitaxial layer 50 so that the half-buried dielectric film 59 can have the necessary thickness while the height of the upper surface of the half-buried dielectric film 59 can be generally equal to the height of the upper surface of the STI 64. This facilitates manufacturing and downscaling the CMOS image sensor 31.

It is noted that in this embodiment, a buffer dielectric film may be formed around the half-buried dielectric film 59 like the above second embodiment. This can relieve the stress that the half-buried dielectric film 59 applies to the epitaxial layer 50.

In the example described with reference to the above first to third embodiment, the mesa isolation structure is mixed with the STI in one semiconductor device. However, the invention is not limited thereto, but it is possible to provide only the mesa isolation structure. Also in this case, the area needed for isolation can be reduced, and the device can be downscaled. Furthermore, the amount of protrusion of the half-buried dielectric film can be reduced, which facilitates manufacturing.

The invention has been described with reference to the embodiments. However, the invention is not limited to these embodiments. For example, any addition, deletion, or design change of components, or any addition, omission, or condition change of processes in the above embodiments suitably made by those skilled in the art are also encompassed within the scope of the invention as long as they fall within the spirit of the invention.

The invention claimed is:

1. A semiconductor device comprising:
   a semiconductor substrate;
   a first-conductivity-type region formed in an upper portion of the semiconductor substrate and having a first conductivity type;
   a second-conductivity-type region formed in the upper portion of the semiconductor substrate, in contact with the first-conductivity-type region, and having a second conductivity type that is different from the first conductivity type;
   a buried dielectric film provided immediately above the second-conductivity-type region, the buried dielectric film having a lower portion buried in the semiconductor substrate and an upper portion protruding from an upper surface of the semiconductor substrate, a lower surface of the buried dielectric film being at a level higher than a lower surface of the first-conductive-type region; and
   an element isolation film having a lower portion buried in the semiconductor substrate, having an upper portion protruding from the upper surface of the semiconductor substrate, and having a lower surface located below a lower surface of the buried dielectric film,
   wherein the second-conductivity-type region and the buried dielectric film are in contact with the first-conductivity-type region and isolate the first-conductivity-type region from a region that is on opposite side of the first-conductivity-type region across the second-conductivity-type region and is in contact with the second-conductivity-type region.

2. The semiconductor device according to claim 1, wherein:
   the semiconductor device is an image acquisition device including an imaging region configured to convert incident light to an electrical signal and a processing region configured to process the electrical signal,
   the first-conductivity-type region constitutes a photodiode provided in the imaging region, and
   the element isolation film isolates elements provided in the processing region from each other.

3. A semiconductor device comprising:
   a semiconductor substrate;
   a first-conductivity-type region formed in an upper portion of the semiconductor substrate and having a first conductivity type;
   a second-conductivity-type region formed in the upper portion of the semiconductor substrate, in contact with the first-conductivity-type region, and having a second conductivity type that is different from the first conductivity type;

a buried dielectric film provided immediately above the second-conductivity-type region, the buried dielectric film having a lower portion buried in the semiconductor substrate and an upper portion protruding from an upper surface of the semiconductor substrate, a lower surface of the buried dielectric film being at a level higher than a lower surface of the first-conductive-type region;

an inversion layer of the second-conductivity-type region formed in an upper portion the first-conductivity-type region; and a transistor having a source/drain region in contact with the second-conductivity-type region and the buried dielectric film, wherein the second-conductivity-type region and the buried dielectric film are in contact with the first-conductivity-type region and isolate the first-conductivity-type region from a region that is on opposite side of the first-conductivity-type region across the second-conductivity-type region and is in contact with the second-conductivity-type region, and wherein the lower surface of the buried dielectric film is located:
  below a position where impurity concentration is maximized in an impurity concentration profile along depth of the inversion layer,
  below a position where impurity concentration is maximized in an impurity concentration profile along depth of the source/drain region, and
  above a position where impurity concentration is maximized in an impurity concentration profile along depth of the first-conductivity-type region.

4. The semiconductor device according to claim 3, wherein the position where impurity concentration is maximized in an impurity concentration profile along depth of the first-conductivity-type region is located below the position where impurity concentration is maximized in an impurity concentration profile along depth of the source/drain region.

5. A semiconductor device comprising:
  a semiconductor substrate;
  a first-conductivity-type region formed in an upper portion of the semiconductor substrate and having a first conductivity type;
  a second-conductivity-type region formed in the upper portion of the semiconductor substrate, in contact with the first-conductivity-type region, and having a second conductivity type that is different from the first conductivity type;
  a buried dielectric film provided immediately above the second-conductivity-type region, the buried dielectric film having a lower portion buried in the semiconductor substrate and an upper portion protruding from an upper surface of the semiconductor substrate, a lower surface of the buried dielectric film being at a level higher than a lower surface of the first-conductive-type region;
  a buffer dielectric film covering the lower portion of the buried dielectric film and formed from a dielectric material that is different from the material of the buried dielectric film; and
  an element isolation film having a lower portion buried in the semiconductor substrate, having an upper portion protruding from the upper surface of the semiconductor substrate, and having a lower surface located below a lower surface of the buried dielectric film,
  wherein the second-conductivity-type region and the buried dielectric film are in contact with the first-conductivity-type region and isolate the first-conductivity-type region from a region that is on opposite side of the first-conductivity-type region across the second-conductivity-type region and is in contact with the second-conductivity-type region.

6. The semiconductor device according to claim 5, wherein the buried dielectric film is formed from silicon oxide, and the buffer dielectric film is formed from silicon nitride.

7. The device according to claim 5, wherein:
  the semiconductor device is an image acquisition device including an imaging region configured to convert incident light to an electrical signal and a processing region configured to process the electrical signal,
  the first-conductivity-type region constitutes a photodiode provided in the imaging region, and
  the element isolation film isolates elements provide in the processing region from each other.

8. The semiconductor device according to claim 7, further comprising:
  an inversion layer of the second conductivity type formed in an upper portion of the first-conductivity-type region; and
  a transistor having a source/drain region in contact with the second-conductivity-type region and the buried dielectric film,
  wherein the lower surface of the buried dielectric film is located:
    below a position where impurity concentration is maximized in an impurity concentration profile along depth of the inversion layer,
    below a position where impurity concentration is maximized in an impurity concentration profile along depth of the source/drain region, and
    above a position where impurity concentration is maximized in an impurity concentration profile along depth of the first-conductivity-type region.

* * * * *